(12) United States Patent
Redgrave et al.

(10) Patent No.: US 7,788,478 B2
(45) Date of Patent: Aug. 31, 2010

(54) ACCESSING MULTIPLE USER STATES CONCURRENTLY IN A CONFIGURABLE IC

(75) Inventors: Jason Redgrave, Mountain View, CA (US); Brad Hutchings, Fremont, CA (US); Steven Teig, Menlo Park, CA (US); Herman Schmit, Palo Alto, CA (US); Teju Khubchandani, Milpitas, CA (US)

(73) Assignee: Tabula, Inc., Santa Clara, CA (US)

( * ) Notice: Subject to any disclaimer, the term of this patent is extended or adjusted under 35 U.S.C. 154(b) by 1042 days.

(21) Appl. No.: 11/375,562

(22) Filed: Mar. 13, 2006

(65) Prior Publication Data

US 2008/0191735 A1 Aug. 14, 2008

Related U.S. Application Data

(60) Provisional application No. 60/699,463, filed on Jul. 15, 2005.

(51) Int. Cl.
*H03K 19/00* (2006.01)

(52) U.S. Cl. ............................... 713/100; 713/1; 326/9; 326/16; 326/38; 326/39

(58) Field of Classification Search ...................... 713/1, 713/100; 326/9, 16, 38, 39
See application file for complete search history.

(56) References Cited

U.S. PATENT DOCUMENTS 5,425,036 A 6/1995 Liu et al.

(Continued)

FOREIGN PATENT DOCUMENTS

WO PCT/US2008/061072 4/2008

(Continued)

OTHER PUBLICATIONS

U.S. Appl. No. 12/050,897, filed Mar. 18, 2008, Redgrave, Jason, et al., Commonly Owned Application with similar specification and drawings.

(Continued)

*Primary Examiner*—Abdelmoniem Elamin
(74) *Attorney, Agent, or Firm*—Adeli & Tollen LLP

(57) ABSTRACT

Some embodiments of the invention provide a configuration/debug network for configuring and debugging a configurable integrated circuit (IC). The configurable IC in some embodiments includes configurable resources (e.g., configurable logic resources, routing resources, memory resources, etc.) that can be grouped in conceptual configurable tiles that are arranged in several rows and columns. Some embodiments allow tiles to be individually addressed, globally addressed (i.e., all addressed together), or addressed based on their tile types. The configurable IC includes numerous user-design state elements ("UDS elements") in some embodiments. In some embodiments, the configuration/debug network has a streaming mode that can direct various circuits in one or more configurable tiles to stream out their data during the operation of the configurable IC. Accordingly, in the embodiments where the configuration/debug network connects to some or all of the UDS elements, the configurable/debug network can be used in a streaming mode to stream out data from the UDS elements of the tiles, in order to identify any errors in the operation of the IC. In other words, the streaming of the data from the UDS elements can be used to debug the operation of the configurable IC. In some embodiments, the configuration/debug network has a broadcasting mode that can direct various resources (e.g., memories, storage elements, etc.) in one or more configurable tiles to store the same data. For instance, the broadcasting mode can be used to initialize the memory blocks in the configurable memory tiles.

24 Claims, 28 Drawing Sheets

U.S. PATENT DOCUMENTS

| | | | |
|---|---|---|---|
| 5,426,378 | A | 6/1995 | Ong |
| 5,452,239 | A | 9/1995 | Dai et al. |
| 5,521,835 | A | 5/1996 | Trimberger |
| 5,578,946 | A | 11/1996 | Carberry et al. |
| 5,600,263 | A | 2/1997 | Trimberger et al. |
| 5,610,829 | A | 3/1997 | Trimberger |
| 5,629,637 | A | 5/1997 | Trimberger et al. |
| 5,640,106 | A | 6/1997 | Erickson et al. |
| 5,640,107 | A | 6/1997 | Kruse |
| 5,646,545 | A | 7/1997 | Trimberger et al. |
| 5,654,650 | A | 8/1997 | Gissel |
| 5,701,441 | A | 12/1997 | Trimberger |
| 5,751,735 | A | 5/1998 | Tobin et al. |
| 5,761,483 | A | 6/1998 | Trimberger |
| 5,796,268 | A | 8/1998 | Kaplinsky |
| 5,811,985 | A | 9/1998 | Trimberger et al. |
| 5,825,662 | A | 10/1998 | Trimberger |
| 5,920,712 | A | 7/1999 | Kuijsten |
| 5,944,813 | A | 8/1999 | Trimberger |
| 6,049,222 | A | 4/2000 | Lawman |
| 6,057,707 | A | 5/2000 | Schleicher et al. |
| 6,084,429 | A | 7/2000 | Trimberger |
| 6,182,247 | B1 | 1/2001 | Herrmann et al. |
| 6,204,687 | B1 | 3/2001 | Schultz et al. |
| 6,255,849 | B1 | 7/2001 | Mohan |
| 6,389,558 | B1 | 5/2002 | Herrmann et al. |
| 6,404,224 | B1 | 6/2002 | Azegami et al. |
| 6,430,736 | B1 | 8/2002 | Levi et al. |
| 6,446,249 | B1 | 9/2002 | Wang et al. |
| 6,459,646 | B1 | 10/2002 | Yee et al. |
| 6,460,148 | B2 | 10/2002 | Veenstra et al. |
| 6,480,954 | B2 | 11/2002 | Trimberger |
| 6,539,535 | B2 | 3/2003 | Butts et al. |
| 6,601,227 | B1 | 7/2003 | Trimberger |
| 6,614,703 | B2 | 9/2003 | Pitts et al. |
| 6,658,564 | B1 * | 12/2003 | Smith et al. ............... 713/100 |
| 6,668,237 | B1 | 12/2003 | Guccione et al. |
| 6,681,353 | B1 | 1/2004 | Barrow |
| 6,704,889 | B2 | 3/2004 | Veenstra et al. |
| 6,711,729 | B1 | 3/2004 | McElvain et al. |
| 6,725,442 | B1 | 4/2004 | Cote et al. |
| 6,791,352 | B2 | 9/2004 | Verdoorn et al. |
| 6,802,026 | B1 | 10/2004 | Patterson et al. |
| 6,810,442 | B1 | 10/2004 | Lin et al. |
| 6,823,224 | B2 | 11/2004 | Wood et al. |
| 6,829,751 | B1 | 12/2004 | Shen et al. |
| 6,829,756 | B1 | 12/2004 | Trimberger |
| 6,889,368 | B1 | 5/2005 | Mark et al. |
| 6,894,527 | B1 | 5/2005 | Donlin et al. |
| 6,897,678 | B2 | 5/2005 | Zaveri et al. |
| 6,937,681 | B2 | 8/2005 | Watanabe |
| 6,959,397 | B2 | 10/2005 | Cafaro et al. |
| 6,996,738 | B2 | 2/2006 | Chiang |
| 7,010,667 | B2 | 3/2006 | Vorbach et al. |
| 7,064,577 | B1 | 6/2006 | Lee |
| 7,085,858 | B1 | 8/2006 | Fox et al. |
| 7,088,132 | B1 * | 8/2006 | Tang et al. ............... 326/39 |
| 7,095,247 | B1 * | 8/2006 | Tang et al. ............... 326/38 |
| 7,112,992 | B1 | 9/2006 | Guzman et al. |
| 7,112,993 | B2 | 9/2006 | Speers |
| 7,138,827 | B1 | 11/2006 | Trimberger |
| 7,171,548 | B2 * | 1/2007 | Smith et al. ............... 713/1 |
| 7,191,372 | B1 | 3/2007 | Jacobson et al. |
| 7,212,448 | B1 | 5/2007 | Trimberger |
| 7,218,137 | B2 | 5/2007 | Vadi et al. |
| 7,219,265 | B2 | 5/2007 | Yee |
| 7,231,339 | B1 | 6/2007 | Nemecek et al. |
| 7,233,169 | B1 | 6/2007 | Vadi |
| 7,375,550 | B1 | 5/2008 | Redgrave et al. |
| 7,443,196 | B2 | 10/2008 | Redgrave et al. |
| 7,467,335 | B2 | 12/2008 | Otto et al. |
| 7,492,186 | B2 | 2/2009 | Hutchings et al. |
| 7,501,855 | B2 | 3/2009 | Hutchings et al. |
| 7,512,850 | B2 | 3/2009 | Redgrave et al. |
| 7,548,085 | B2 | 6/2009 | Hutchings et al. |
| 7,548,090 | B2 | 6/2009 | Redgrave et al. |
| 7,550,991 | B2 | 6/2009 | Redgrave et al. |
| 7,579,867 | B2 | 8/2009 | Hutchings et al. |
| 7,595,655 | B2 | 9/2009 | Hutchings et al. |
| 7,652,498 | B2 | 1/2010 | Hutchings et al. |
| 2001/0033188 | A1 | 10/2001 | Aung et al. |
| 2002/0010853 | A1 | 1/2002 | Trimberger et al. |
| 2002/0089349 | A1 | 7/2002 | Barbier et al. |
| 2002/0093371 | A1 | 7/2002 | Atkinson |
| 2003/0100133 | A1 | 5/2003 | Eidson et al. |
| 2005/0046458 | A1 | 3/2005 | Schroeder et al. |
| 2005/0216671 | A1 | 9/2005 | Rothman et al. |
| 2006/0125517 | A1 | 6/2006 | van Wageningen et al. |
| 2006/0176075 | A1 | 8/2006 | Or-Bach |
| 2006/0251416 | A1 | 11/2006 | Letner et al. |
| 2007/0006053 | A1 | 1/2007 | Otto et al. |
| 2007/0007999 | A1 | 1/2007 | Graham et al. |
| 2007/0143577 | A1 | 6/2007 | Smith |
| 2008/0191733 | A1 | 8/2008 | Redgrave et al. |
| 2008/0191736 | A1 | 8/2008 | Redgrave et al. |
| 2008/0222465 | A1 | 9/2008 | Redgrave et al. |
| 2008/0258761 | A1 | 10/2008 | Hutchings et al. |
| 2008/0272802 | A1 | 11/2008 | Hutchings et al. |
| 2009/0002020 | A1 | 1/2009 | Hutchings et al. |
| 2009/0002022 | A1 | 1/2009 | Hutchings |
| 2009/0007027 | A1 | 1/2009 | Hutchings et al. |
| 2009/0079468 | A1 | 3/2009 | Redgrave et al. |

FOREIGN PATENT DOCUMENTS

| | | |
|---|---|---|
| WO | PCT/US2008/061074 | 4/2008 |
| WO | WO 2009/002600 | 12/2008 |
| WO | WO 2009/039462 | 3/2009 |
| WO | WO 2009/131569 | 10/2009 |
| WO | WO 2010/016857 | 2/2010 |

OTHER PUBLICATIONS

U.S. Appl. No. 11/375,363, filed Mar. 13, 2006, Redgrave, Jason, et al., Commonly Owned Application with similar specification and drawings.

U.S. Appl. No. 11/375,370, filed Mar. 13, 2006, Redgrave, Jason, et al., Commonly Owned Application with similar specification and drawings.

U.S. Appl. No. 11/375,369, filed Mar. 13, 2006, Redgrave, Jason, et al., Commonly Owned Application with similar specification and drawings.

U.S. Appl. No. 11/375,364, filed Mar. 13, 2006, Hutchings, Brad, et al., Commonly Owned Application with similar specification and drawings.

U.S. Appl. No. 12/106,257, filed Apr. 18, 2008, Hutchings, Brad, et al., Commonly Owned Application with similar specification and drawings.

U.S. Appl. No. 11/375,561, filed Mar. 13, 2006, Hutchings, Brad, et al., Commonly Owned Application with similar specification and drawings.

U.S. Appl. No. 11/769,680, filed Jun. 27, 2007, Hutchings, Brad, et al., Commonly Owned Application with similar specification and drawings.

U.S. Appl. No. 11/769,683, filed Jun. 27, 2007, Hutchings, Brad, et al., Commonly Owned Application with similar specification and drawings.

U.S. Appl. No. 11/769,703, filed Jun. 27, 2007, Hutchings, Brad, et al., Commonly Owned Application with similar specification and drawings.

Non-Final Office Action for U.S. Appl. No. 11/769,703, Apr. 21, 2008 (mailing date), Hutchings, Brad, et al.

Notice of Allowance for U.S. Appl. No. 11/375,362, Feb. 14, 2008 (mailing date), Redgrave, Jason, et al., now issued U.S. Patent 7,375,550.

Notice of Allowance for U.S. Appl. No. 11/375,363, Jun. 5, 2008 (mailing date), Redgrave, Jason, et al.
Non-Final Office Action for U.S. Appl. No. 11/375,370, Jul. 11, 2008 (mailing date), Redgrave, Jason, et al.
Notice of Allowance for U.S. Appl. No. 11/375,369, Apr. 9, 2008 (mailing date), Redgrave, Jason, et al.
Non-Final Office Action for U.S. Appl. No. 11/375,369, Aug. 21, 2007 (mailing date), Redgrave, Jason, et al.
Notice of Allowance for U.S. Appl. No. 11/375,364, Mar. 12, 2008 (mailing date), Hutchings, Brad, et al.
Graham, Paul, et al., "Instrumenting Bitstreams for Debugging FPGA Circuits", *Proceedings of the 9th Annual IEEE Symposium on Field-Programmable Custom Computing Machines (FCCM'01)*, Apr. 29-May 2, 2001.
Hauser, J., et al., "Garp: A MIPS Processor with a Reconfigurable Coprocessor", *FPGAs for Custom Computing Machines, 1997. Proceedings., The 5th Annual IEEE Symposium on FPGA-Based Custom Computing Machines*, Apr. 16-18, 1997, pp. 12-21.
Luk, W., et al., "Compilation Tools for Run-Time Reconfigurable Designs", *FPGAs for Custom Computing Machines, 1997. Proceedings., The 5th Annual IEEE Symposium on FPGA-Based Custom Computing Machines*, Apr. 16-18, 1997, pp. 56-65.
Scalera, S., et al., "The Design and Implementation of a Context Switching FPGA", *FPGAs for Custom Computing Machines, 1998. Proceedings. IEEE Symposium on FPGAs for Custom Computing Machines*, Apr. 15-17, 1998, pp. 78-85.
Non-Final Office Action of U.S. Appl. No. 12/050,897, Sep. 18, 2008 (mailing date), Redgrave, Jason, et al.
Restriction Requirement of U.S. Appl. No. 11/375,363, Feb. 25, 2008 (mailing date), Redgrave, Jason, et al.
U.S. Appl. No. 12/235,581, filed Sep. 22, 2008, Redgrave, Jason, et al.
Non-Final Office Action of U.S. Appl. No. 11/375,369, Aug. 20, 2008 (mailing date), Redgrave, Jason, et al.
Notice of Allowance of U.S. Appl. No. 11/375,364, Aug. 27, 2008 (mailing date), Hutchings, Brad, et al.
Non-Final Office Action of U.S. Appl. No. 11/375,561, Oct. 2, 2008 (mailing date), Hutchings, Brad, et al.
Notice of Allowance of U.S. Appl. No. 11/769,703, Oct. 24, 2008 (mailing date), Hutchings, Brad, et al.
International Search Report and Written Opinion of PCT/US2008/061074, Oct. 23, 2008 (mailing date), Tabula, Inc.
International Search Report and Written Opinion of PCT/US2008/061072, Sep. 15, 2008 (mailing date), Tabula, Inc.
Claims of Related Applications, Document listing claims of Pending U.S. Appl. Nos. 11/375,362, 11/375,363, 11/375,370, 11/375,369, 11/375,364, and 11/375,561.
Non-final office action for U.S. Appl. No. 11/375,362, Jul. 18, 2007 (mailing date), Redgrave.
Non-final office action for U.S. Appl. No. 11/375,363, Jul. 26, 2007 (mailing date), Redgrave.
Non-final office action for U.S. Appl. No. 11/375,364, Jul. 6, 2007 (mailing date), Hutchings.
Trimberger, S., "Effects of FPGA Architecture on FPGA Routing," *32nd ACM/IEEE Design Automation Conference*, Jun. 1995, ACM.
Altera Corp., "Section V. In-System Design Debugging," *Quartus II Handbook*, May 2007, pp. 1-150, vol. 3.
Amerson, R., et al., "Teramac—Configurable Custom Computing," 1995 Month N/A, pp. 32-38, Palo Alto, CA, USA.
Arnold, J., "The Splash 2 Software Environment," *IDA Supercomputing Research Center*, 1993 Month N/A, pp. 88-93, Bowie, MD, USA.
Arnold, J., et al, "Splash 2," *Supercomputing Research Center*, 1992 Month N/A, pp. 316-322, New York, NY, USA.
Butts, M., "Future Directions of Dynamically Reprogrammable Systems," *IEEE 1995 Custom Integrated Circuits Conference*, May 1995, pp. 487-494, IEEE.
Comptom, K., et al., "Reconfigurable Computing: A Survey of Systems and Software," *ACM Computing Surveys*, Jun. 2002, pp. 171-210, vol. 34., No. 2, New York, New York.
Graham, P., "Logical Hardware Debuggers for FPGA-Based Systems," *A Dissertation Submitted to the Faculty of Brigham Young University in Partial Fulfillment of the Requirements for the Degree of Doctor of Philosophy in Brigham Young University*, 2001 Month N/A, pp. 1-266.
Hanono, S., "InnerView Hardware Debugger: A Logic Analysis Tool for the Virtual Wires Emulation System", *Submitted to the Department of Electrical Engineering and Computer Science in Partial Fulfillment of the Requirements for the Degree of Master of Science at the Massachusetts Institute of Technology*, Feb. 1995, pp. 1-59.
Hutchings, B., "Unifying Simulation and Execution in a Design Environment for FPGA Systems," *IEEE Transactions on Very Large Scale Integration (VLSI) Systems*, Feb. 2001, pp. 201-205, vol. 9, No. 1, IEEE.
Hutchings, B., et al., "A CAD Suite for High-Performance FPGA Design," 1999 Month N/A, pp. 1-16, Provo, UT, USA.
Hutchings, B., et al., "Designing and Debugging Custom Computing Applications," *IEEE Design & Test of Computers*, Jan. 2000, pp. 20-28.
Ronsse, M., et al., "Record/Play for Nondeterministic Program Executions," *Communications of the ACM*, Sep. 2003, pp. 62-67, vol. 46, No. 9.
Vuillemin, J., et al., "Programmable Active Memories: Reconfigurable Systems Come of Age," Mar. 1996, pp. 1-15.
Xilinx, Inc., "ChipScope ProSoftware and Cores User Guide," Jan. 10, 2007, pp. 1-206, Xilinx Inc.
Xilinx, Inc., "Virtex-5 FPGA," Configuration User Guide, Feb. 2007, pp. 1-154, Xilinx, Inc.
Xu, M., et al., "A 'Flight Data Recorder' for Enabling Full-System Multiprocessor Deterministic Replay," *Proceedings of the 30th Annual International Symposium on Computer Architecture*, Jun. 2003, San Diego, California.
Notice of Allowance of U.S. Appl. No. 12/050,897, Feb. 4, 2009 (mailing date), Redgrave, Jason, et al.
Notice of Allowance of U.S. Appl. No. 11/375,370, Nov. 10, 2008 (mailing date), Redgrave, Jason, et al.
Notice of Allowance of U.S. Appl. No. 11/375,369, Jan. 27, 2009 (mailing date), Redgrave, Jason, et al.
Non-Final Office Action of U.S. Appl. No. 12/106,257, Apr. 24, 2009 (mailing date), Hutchings, Brad, et al.
Notice of Allowance of U.S. Appl. No. 11/375,561, Jan. 30, 2009 (mailing date), Hutchings, Brad, et al.
U.S. Appl. No. 12/637,745, filed Dec. 14, 2009, Hutchings, Brad, et al.
Updated portions of prosecution history of U.S. Appl. No. 11/375,362, Nov. 19, 2007, Redgrave, Jason, et al.
Updated portions of prosecution history of U.S. Appl. No. 12/050,897, Dec. 16, 2008, Redgrave, Jason, et al.
Updated portions of prosecution history of U.S. Appl. No. 11/375,363, Sep. 5, 2008, Redgrave, Jason, et al.
Updated portions of prosecution history of U.S. Appl. No. 12/235,581, Mar. 2, 2010, Redgrave, Jason, et al.
Updated portions of prosecution history of U.S. Appl. No. 11/375,370, Oct. 13, 2008, Redgrave, Jason, et al.
Updated portions of prosecution history of U.S. Appl. No. 11/375,369, Nov. 20, 2008, Redgrave, Jason, et al.
Updated portions of prosecution history of U.S. Appl. No. 11/375,364, Nov. 21, 2008, Hutchings, Brad, et al.
Updated portions of prosecution history of U.S. Appl. No. 12/106,257, Sep. 21, 2009, Hutchings, Brad, et al.
Updated portions of prosecution history of U.S. Appl. No. 11/375,561, Dec. 16, 2008, Hutchings, Brad, et al.
Updated portions of prosecution history of U.S. Appl. No. 11/769,680, Feb. 26, 2010, Hutchings, Brad, et al.
Updated portions of prosecution history of U.S. Appl. No. 11/769,683, Jan. 21, 2010, Hutchings, Brad, et al.
Portions of prosecution history of U.S. Appl. No. 11/769,686, May 15, 2009, Hutchings, Brad, et al.
Portions of prosecution history of U.S. Appl. No. 11/769,706, May 21, 2009, Hutchings, Brad, et al.
Updated portions of prosecution history of U.S. Appl. No. 11/769,703, Dec. 10, 2008, Hutchings, Brad, et al.
Portions of prosecution history of U.S. Appl. No. 11/769,702, Mar. 1, 2010, Hutchings, Brad.

Portions of prosecution history of U.S. Appl. No. 11/769,701, Sep. 4, 2009, Hutchings, Brad, et al.
International Preliminary Report on Patentability for PCT/US2008/061072, Jan. 5, 2010 (mailing date), Tabula, Inc.
International Search Report and Written Opinion for PCT/US2008/077141, Dec. 18, 2008 (mailing date), Tabula Inc.
International Search Report and Written Opinion for PCT/US2008/088492, Mar. 20, 2009 (mailing date), Tabula, Inc.
Notice of Allowance of U.S. Appl. No. 12/235,581, Dec. 2, 2009 (mailing date), Redgrave, Jason, et al.
Notice of Allowance of U.S. Appl. No. 12/106,257, Nov. 16, 2009 (mailing date), Hutchings, Brad, et al.
Non-Final Office Action of U.S. Appl. No. 11/769,683, Sep. 21, 2009 (mailing date), Hutchings, Brad, et al.

* cited by examiner

ACCESSING MULTIPLE USER STATES CONCURRENTLY IN A CONFIGURABLE IC

CLAIM OF BENEFIT TO PRIOR APPLICATIONS

This applications claims priority to prior filed U.S. Provisional Patent Application 60/699,463 filed on Jul. 15, 2005.

CROSS REFERENCE TO RELATED APPLICATIONS

This Application is related to the following applications: U.S. patent application Ser. No. 11/375,362, filed Mar. 13, 2006, now issued as U.S. Pat. No. 7,375,550; U.S. patent application Ser. No. 12/050,897, filed Mar. 18, 2008; U.S. patent application Ser. No. 11/375,363, filed Mar. 13, 2006, now issued as U.S. Pat. No. 7,443,196; U.S. patent application Ser. No. 12/235,581, filed Sep. 22, 2008; U.S. patent application Ser. No. 11/375,370, filed Mar. 13, 2006; U.S. patent application Ser. No. 11/375,369, filed Mar. 13, 2006; U.S. patent application Ser. No. 11/375,364, filed Mar. 13, 2006; U.S. patent application Ser. No. 12/106,257, filed Apr. 18, 2008; and U.S. patent application Ser. No. 11/375,561, filed Mar. 13, 2006.

FIELD OF THE INVENTION

The present invention is directed towards accessing multiple user states concurrently in a configurable IC.

BACKGROUND OF THE INVENTION

The use of configurable integrated circuits ("IC's") has dramatically increased in recent years. One example of a configurable IC is a field programmable gate array ("FPGA"). An FPGA is a field programmable IC that usually has configurable logic and interconnect circuits that are surrounded by input/output (i/o) circuits.

The configurable logic circuits (also called logic blocks) are typically arranged as an internal array of circuits. A configurable logic circuit can be configured to perform a number of different functions. A configurable logic circuit typically receives a set of input data and a set of configuration data that is often stored close to the logic circuit. From the set of functions that the logic circuit can perform, the configuration data set specifies a particular function that this circuit is to perform on the input data set. Such a logic circuit is said to be configurable, as the configuration data set "configures" the logic circuit to perform a particular function.

These logic circuits are connected together through numerous configurable interconnect circuits (also called interconnects). A configurable interconnect circuit connects a set of input data to a set of output data based on a set of configuration data that it receives. The configuration bits specify how the interconnect circuit should connect the input data set to the output data set. The interconnect circuit is said to be configurable, as the configuration data set "configures" the interconnect circuit to use a particular connection scheme that connects the input data set to the output data set in a desired manner. In some FPGA's, the configuration data set of a configurable logic or interconnect set can be modified by writing new data in SRAM cells that store the configuration data set.

Most configurable IC's need to load configuration data in storage cells that store such data for use by configurable logic and/or interconnect circuits. Prior mechanisms for loading such data are a bit slow as they provide only low bandwidth architectures for loading configuration data. In addition, these prior mechanisms do not provide a random access way for loading the configuration data.

Therefore, there is a need in the art for a better mechanism for loading configuration data in storage cells used for storing configuration data for configurable logic and/or interconnect circuits. There is also a need for a better ways to monitor and debug operations of configurable IC's. Ideally, the mechanism for loading configuration data could also be partly used to monitor and debug the configurable IC.

SUMMARY OF THE INVENTION

Some embodiments of the invention provide a configuration/debug network for configuring and debugging a configurable integrated circuit (IC). The configurable IC in some embodiments includes configurable resources (e.g., configurable logic resources, routing resources, memory resources, etc.) that can be grouped in conceptual configurable tiles that are arranged in several rows and columns. In some embodiments, each configurable tile receives a set of lines that are part of the configuration/debug network.

Some embodiments use a packet switching technology to route data to and from the resources in the configurable tiles through the configuration/debug network. Over the lines of the configuration/debug network, some embodiments can route variable length data packets to each configurable tile in a sequential or random access manner.

In some embodiments, each packet includes several frames, with an initial set of frames in a packet specifying the routing of the packet to a configurable tile. For instance, the first two frames of a packet might respectively identify the column and then the row of the configurable tile to be configured.

Some embodiments have different types of configurable tiles, such as one or more configurable logic tile types, one or more configurable memory tile types, one or more configurable edge tiles, etc. Some of these embodiments allow tiles to be individually addressed, globally addressed (i.e., all addressed together), or addressed based on their tile types.

The configurable IC includes numerous user-design state elements ("UDS elements") in some embodiments. UDS elements are elements that store values that at any particular time define the overall user-design state of the configurable IC at that particular time. Examples of such elements include latches, registers, memories, etc. The configurable IC of some embodiments might not include all such forms of UDS elements, or might include other types of UDS elements.

In some embodiments, the configuration/debug network connects to some or all of the UDS elements (e.g., latches, registers, memories, etc.) of the configurable IC. In some embodiments, the configuration/debug network has a streaming mode that can direct various circuits in one or more configurable tiles to stream out their data during the operation of the configurable IC. Accordingly, in the embodiments where the configuration/debug network connects to some or all of the UDS elements, the configurable/debug network can be used in a streaming mode to stream out data from the UDS elements of the tiles, in order to identify any errors in the operation of the IC. In other words, the streaming of the data from the UDS elements can be used to debug the operation of the configurable IC.

The streaming mode is used in some embodiments to form a logic analyzer, which may be on or off the same IC die that includes the configurable tiles. For instance, some embodiments include a trace buffer on the same IC die as the configurable tiles. This trace buffer can then be used to record the data that is output form one or more tiles during the streaming mode operation of the configurable IC. In other words, the trace buffer can be used to implement an "on-chip" logic analyzer in conjunction with the streaming mode operation of the IC. An "off-chip" logic analyzer can also be formed by using an off-chip trace buffer (i.e., a buffer that is not on the same die as the configurable IC) while using the streaming mode operation of the IC's configuration/debug network.

Some embodiments also use the configuration/debug network to perform checkpointing operations. Checkpointing is a sub-operation of a debug operation. The checkpointing process of some embodiments periodically stops the configurable IC's operations (e.g., stops the IC's operations every few million cycles). At each stoppage of the IC's operations, the checkpointing process uses the configuration/debug network to retrieve the configurable IC's state at that time (e.g., to retrieve the value stored by each UDS element of the configurable IC at that time). Once this process has retrieved the configurable IC's state, it causes the configurable IC to resume its operations. When an error is detected during the debug operation (i.e., after a "crash"), a user or debugging application then loads the mostly recently checkpointed IC state (i.e., stored IC state) within the IC, and resumes the debug operation in a more deliberate manner (e.g., slower or under more supervision) in order to identify the cause of the error.

In some embodiments, the configuration/debug network has a broadcasting mode that can direct various resources (e.g., memories, storage elements, etc.) in one or more configurable tiles to store the same data. For instance, the broadcasting mode can be used to initialize the memory blocks in the configurable memory tiles.

The configuration/debug network of some embodiments is a pipelined network that can carry multiple instructions and data sets for multiple tiles concurrently. This pipelined nature of the network allows the network to rapidly configure the IC. This rapid operation, in turn, allows the configurable IC to re-load configuration data for a first set of configurable circuits while a second set of configurable circuits are operating (i.e., while the IC is operating).

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

In the following description, numerous details are set forth for purpose of explanation. However, one of ordinary skill in the art will realize that the invention may be practiced without the use of these specific details. In other instances, well-known structures and devices are shown in block diagram form in order not to obscure the description of the invention with unnecessary detail.

I. Overview

Some embodiments of the invention provide a configuration/debug network for configuring and debugging a configurable integrated circuit (IC). The configurable IC in some embodiments includes configurable resources (e.g., configurable logic resources, routing resources, memory resources, etc.) that can be grouped in conceptual configurable tiles that are arranged in several rows and columns.

Figure 1:
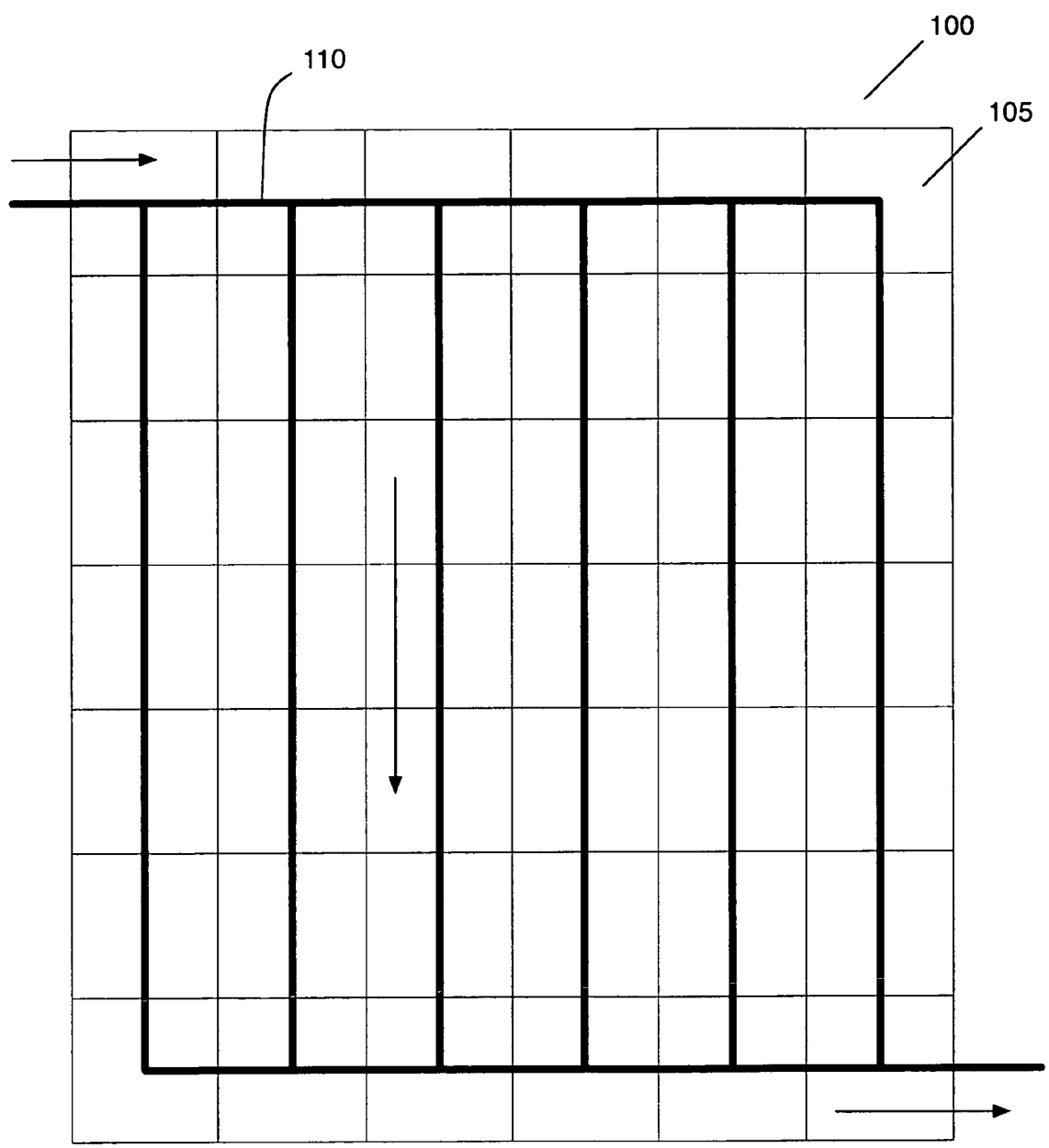
FIG. 1 illustrates an example of a configurable IC that includes numerous configurable tiles.

FIG. 1 illustrates an example of a configurable IC 100 that includes numerous configurable tiles 105. As shown in this figure, each configurable tile 105 receives a set of lines 110 that are part of the configuration/debug network. Some embodiments use a packet switching technology to route data to and from the resources in the configurable tiles. Hence, over the lines 110, these embodiments can route variable length data packets to each configurable tile in a sequential or random access manner.

Figure 2:
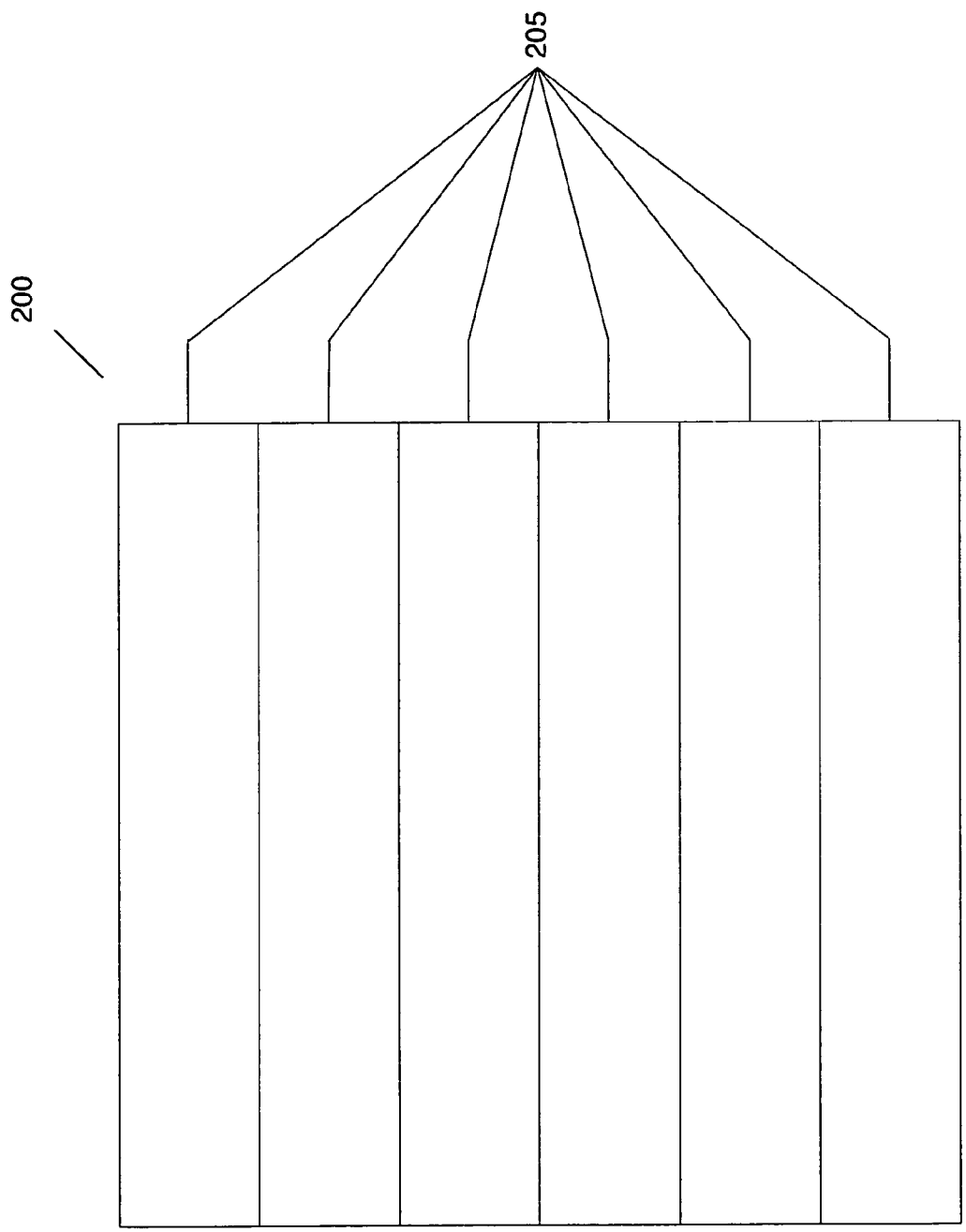
FIG. 2 illustrates an example of a data packet.

FIG. 2 illustrates an example of a data packet 200. As shown in this figure, the data packet 200 includes several data frames 205. In some embodiments, an initial set of frames (e.g., first one or two frames) of the packet identifies configurable tiles for routing the remaining frames of the data packet. These remaining frames can then contain configuration and/or debug data for configuring the tile or performing debug operations on the tile.

Figure 3:
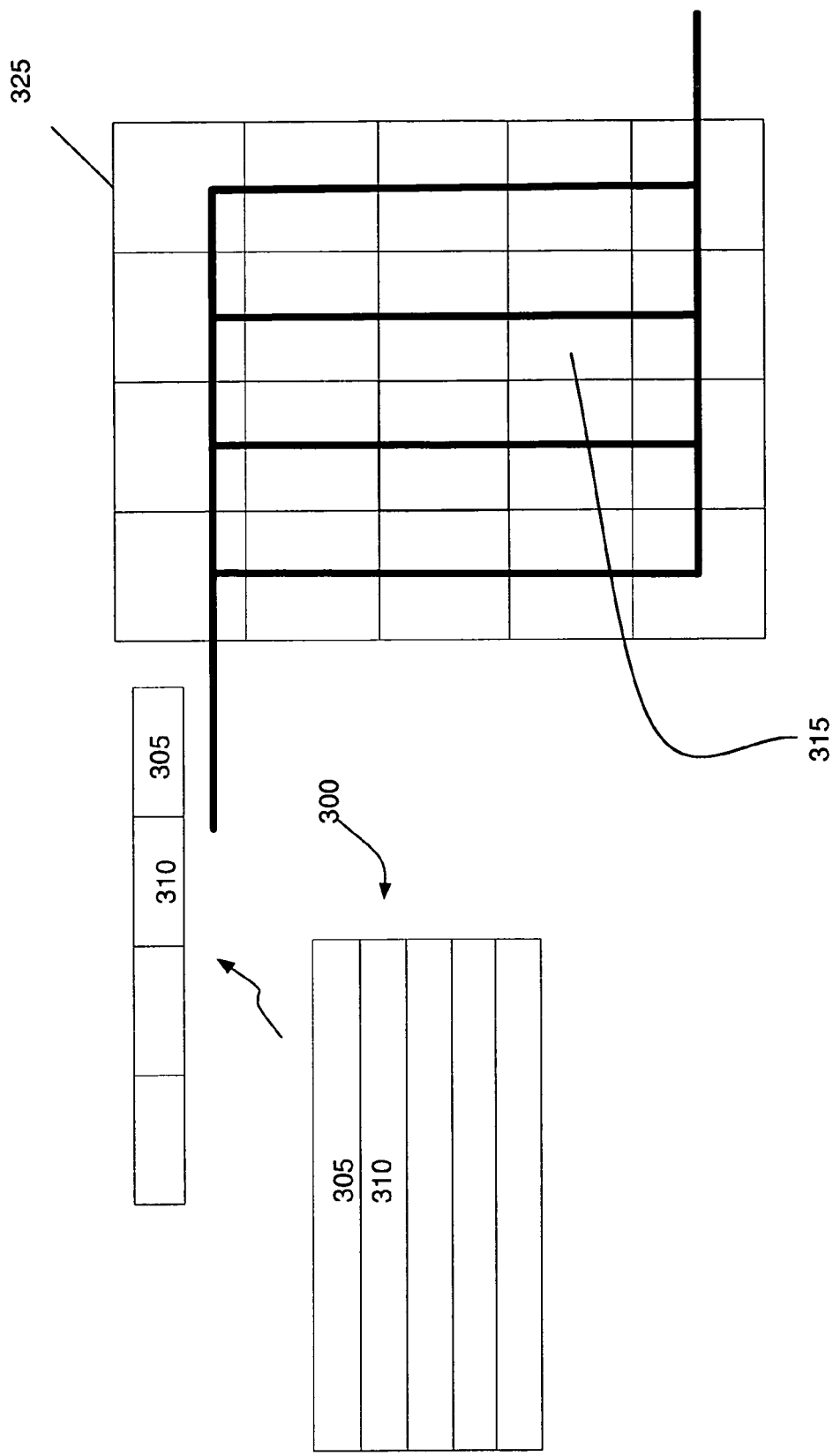
FIGS. 3, 4, and 5 illustrate an example of how an initial set of frames in a packet might specify the routing of a packet to a configurable tile.
Figure 4:
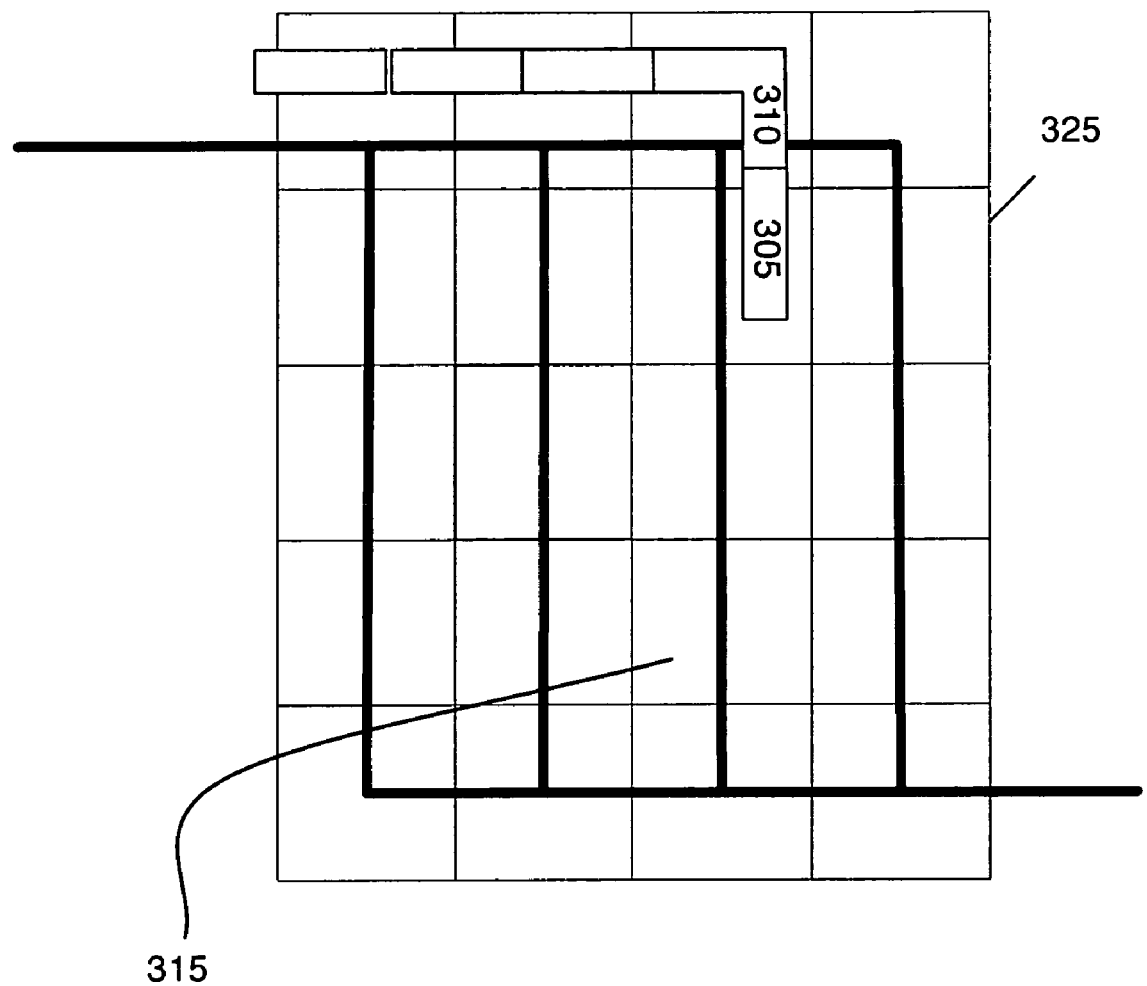
Figure 5:
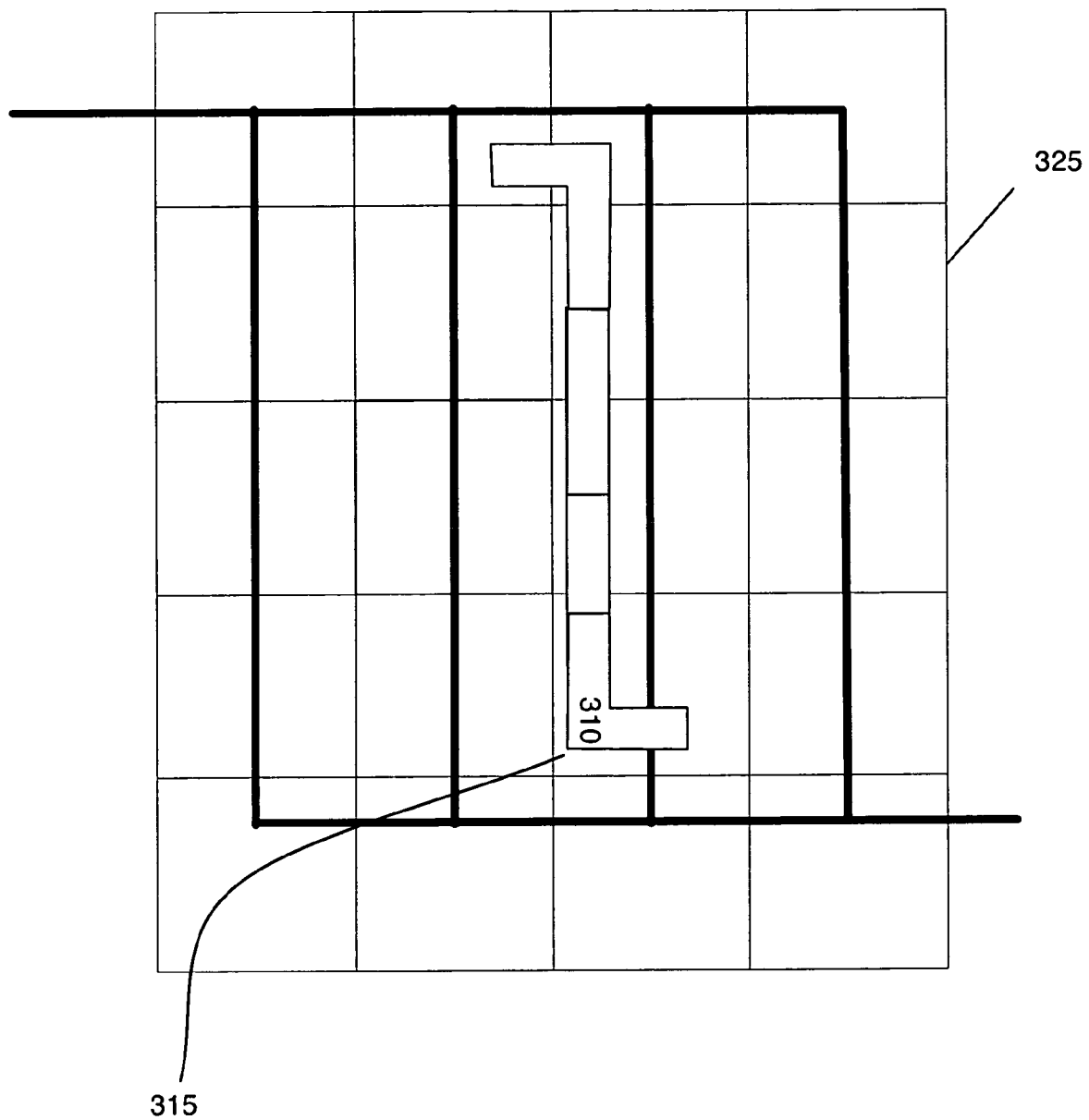

FIGS. 3, 4, and 5 illustrate an example of how an initial set of frames in a packet might specify the routing of a packet to a configurable tile 315. In this example, the first two frames 305 and 310 of the packet 300 respectively identify the column and then the row of the configurable tile 315 to be configured. As shown in FIG. 4, the column-identifying frame 305 is used by a column selector at the top of the configurable tile array 325 to route a packet down the column of the addressed configurable tile 310. The tile-identifying frame 310 then allows a tile selector in the configurable tile 305 to realize that the packet of data being routed down its column configuration lines 325 is addressed to its tile 315, as shown in FIG. 5. Hence, as shown in this figure, the tile selector of tile 315 extracts the remaining data frames in the packet 300.

In some embodiments described below, the column-identifying frame 305 is routed down each column as it serves as (1) a column enable signal for each column that contains an addressed tile, and (2) a column disable signal for each column that contained a previously addressed tile. In some of these embodiments, the tile-identifying frame 310 also is routed down each column before the column select circuitry of the particular column can determine that the particular column does not contain the destination (i.e., addressed) tile for the current packet.

Some embodiments have different types of configurable tiles, such as one or more configurable logic tile types, one or more configurable memory tile types, one or more configurable edge tile types (e.g., north, south, east, and west), etc. Some of these embodiments allow tiles to be individually addressed, globally addressed (i.e., all addressed together), or addressed based on their tile types. Addressing multiple tiles concurrently is beneficial because it allows concurrent reads from or writes to multiple tiles. The tile types and the addressing of these tile types will be further described in Section III below.

The configurable IC includes numerous user-design state elements ("UDS elements") in some embodiments. UDS elements are elements that store values that at any particular time define the overall user-design state of the configurable IC at that particular time. Examples of such elements include latches, registers, memories, etc. The configurable IC of some embodiments might not include all such forms of UDS elements, or might include other types of UDS elements.

In some embodiments, the configuration/debug network connects to some or all of the UDS elements (e.g., latches, registers, memories, etc.) of the configurable IC. In some embodiments, the configuration/debug network has a streaming mode that can direct various circuits in one or more configurable tiles to stream out their data during the operation of the configurable IC. Accordingly, in the embodiments where the configuration/debug network connects to some or all of the UDS elements, the configurable/debug network can be used in a streaming mode to stream out data from the UDS elements of the tiles, in order to identify any errors in the operation of the IC. In other words, the streaming of the data from the UDS elements can be used to debug the operation of the configurable IC.

The streaming mode is used in some embodiments to form a logic analyzer, which may be on or off the same IC die that includes the configurable tiles. For instance, some embodiments include a trace buffer on the same IC die as the configurable tiles. This trace buffer can then be used to record the data that is output form one or more tiles during the streaming mode operation of the configurable IC. In other words, the trace buffer can be used to implement an "on-chip" logic analyzer in conjunction with the streaming mode operation of the IC. An "off-chip" logic analyzer can also be formed by using an off-chip trace buffer (i.e., a buffer that is not on the same die as the configurable IC) while using the streaming mode operation of the IC's configuration/debug network.

Some embodiments also use the configuration/debug network to perform checkpointing operations. Checkpointing is a sub-operation of a debug operation. The checkpointing process of some embodiments periodically stops the configurable IC's operations (e.g., stops the IC's operations every few million cycles). At each stoppage of the IC's operations, the checkpointing process uses the configuration/debug network to retrieve the configurable IC's state at that time (e.g., to retrieve the value stored by each UDS element of the configurable IC at that time). Once this process has retrieved the configurable IC's state, it causes the configurable IC to resume its operations. When an error is detected during the debug operation (i.e., after a "crash"), a user or debugging application then loads the mostly recently checkpointed IC state (i.e., stored IC state) within the IC, and resumes the debug operation in a more deliberate manner (e.g., slower or under more supervision) in order to identify the cause of the error.

In some embodiments, the configuration/debug network has a broadcasting mode that can direct various resources (e.g., memories, storage elements, etc.) in one or more configurable tiles to store the same data. For instance, the broadcasting mode can be used to initialize the memory blocks in the configurable memory tiles.

Section II below provides an overview of the configurable tiles of some embodiments of the invention. Section III then provides a more detailed discussion of the packet data structure of some embodiments of the invention. Next, Section IV provides a more detailed discussion of the configuration/debug network of some embodiments of the invention.

Section V then provides a more detailed discussion of the broadcasting mode operation of some embodiments of the invention. Section VI provides a more detailed discussion of the streaming mode operations of some embodiments. Section VII then describes the logic analyzer and trace buffer functionalities of some embodiments. Section VIII describes the checkpointing process of some embodiments of the invention. Section IX describes the high-speed nature of the configuration/debug network of some embodiments.

In the discussion above and below, many of the features of some embodiments are described by reference to a network that is used for both configuration operations and debug operations. One of ordinary skill in the art will realize that some embodiments might use this network only for debug operations or only for configuration operations.

II. Overview of Configurable Tiles

Figure 6:
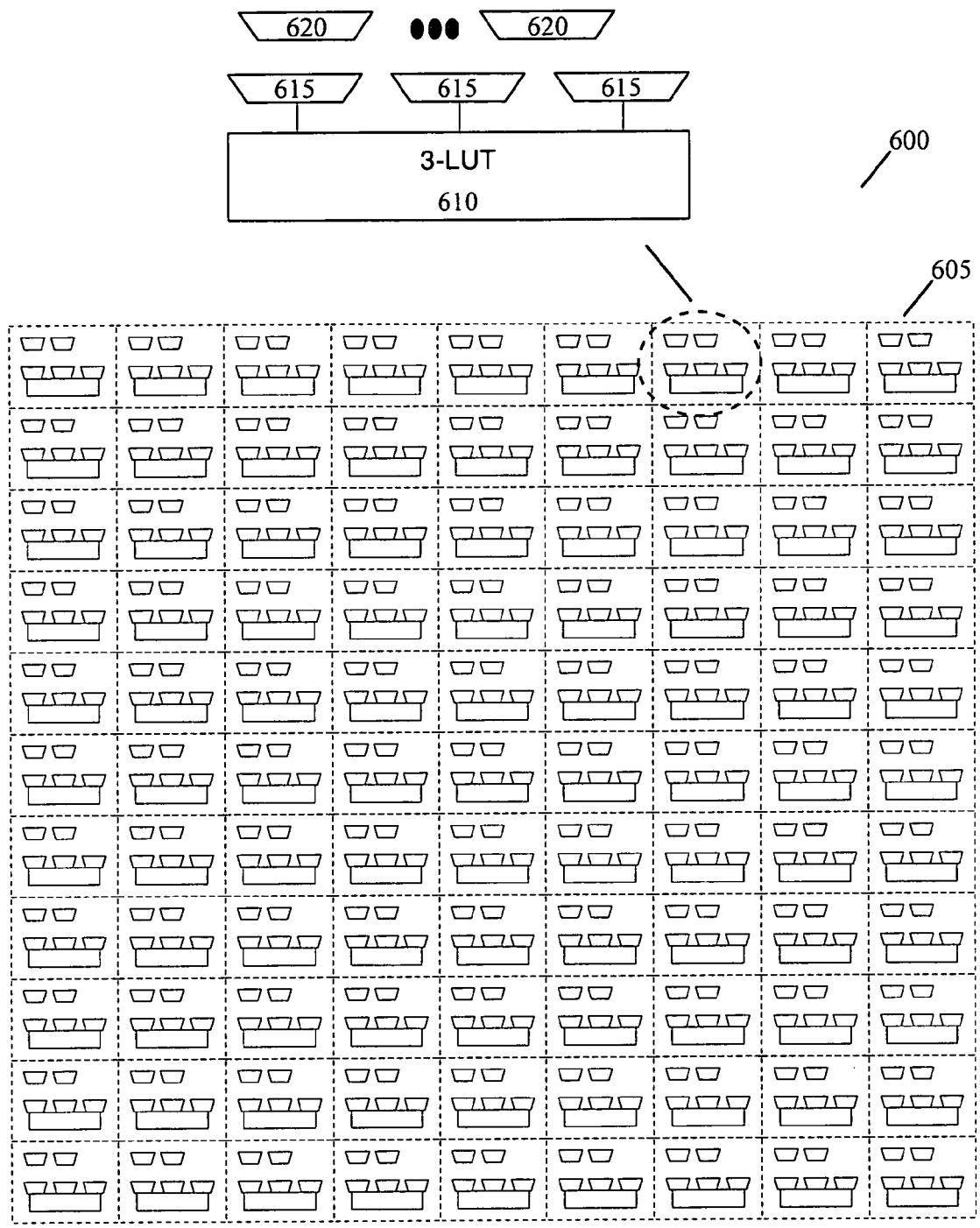
FIG. 6 illustrates the configurable circuit architecture of some embodiments of the invention.

FIG. 6 illustrates the configurable circuit architecture of some embodiments of the invention. As shown in FIG. 6, this architecture is formed by numerous configurable tiles 605 that are arranged in an array with multiple rows and columns. In FIG. 6, each configurable tile is a configurable logic tile, which, in this example, includes one configurable three-input logic circuit 610, three configurable input-select interconnect circuits 615, and eight configurable routing interconnect circuits 620. For each configurable circuit, the configurable IC 600 includes a set of storage elements for storing a set of configuration data.

In some embodiments, the logic circuits are look-up tables (LUTs) while the interconnect circuits are multiplexers. Also, in some embodiments, the LUT's and the multiplexers are sub-cycle reconfigurable circuits, as described in U.S. patent application Ser. No. 11/082,193, filed on Mar. 15, 2005. In some of these embodiments, the configurable IC is a reconfigurable IC that stores multiple sets of configuration data for its sub-cycle reconfigurable circuits, so that reconfigurable circuits can use a different set of configuration data in different sub-cycles.

In FIG. 6, an input-select multiplexer is an interconnect circuit associated with the LUT 610 that is in the same tile as the input select multiplexer. One such input select multiplexer (1) receives several input signals for its associated LUT, and (2) based on its configuration, passes one of these input signals to its associated LUT.

In FIG. 6, a routing multiplexer is an interconnect circuit that at a macro level connects other logic and/or interconnect circuits. Unlike an input select multiplexer of some embodiments (which only provides its output to a single logic circuit, i.e., which only has a fan out of 1), a routing multiplexer of some embodiments is a multiplexer that (1) can provide its output to several logic and/or interconnect circuits (i.e., has a fan out greater than 1), or (2) can provide its output to other interconnect circuits.

In some embodiments, some or all routing multiplexers can also serve as latches. For instance, some embodiments use a complimentary passgate logic (CPL) to implement a routing multiplexer. Some of these embodiments then implement a routing multiplexer that can act as a latch by placing cross-coupled transistors at the output stage of the routing multiplexer. Such an approach is further described in U.S. patent application Ser. No. 11/081,859, filed Mar. 15, 2005. In the discussion below, routing multiplexers that can serve as latches are referred to as routing-circuit latches ("RCLs").

In the architecture illustrated in FIG. 6, each configurable logic tile includes one three-input LUT, three input-select multiplexers, and eight routing multiplexers. Other embodiments, however, might have a different number of LUT's in each tile, different number of inputs for each LUT, different number of input-select multiplexers, and/or different number of routing multiplexers. Other embodiments might also use different types of logic circuits and/or interconnect circuits. Several such architectures are further described in the U.S. application Ser. No. 11/082,193.

Figure 7:
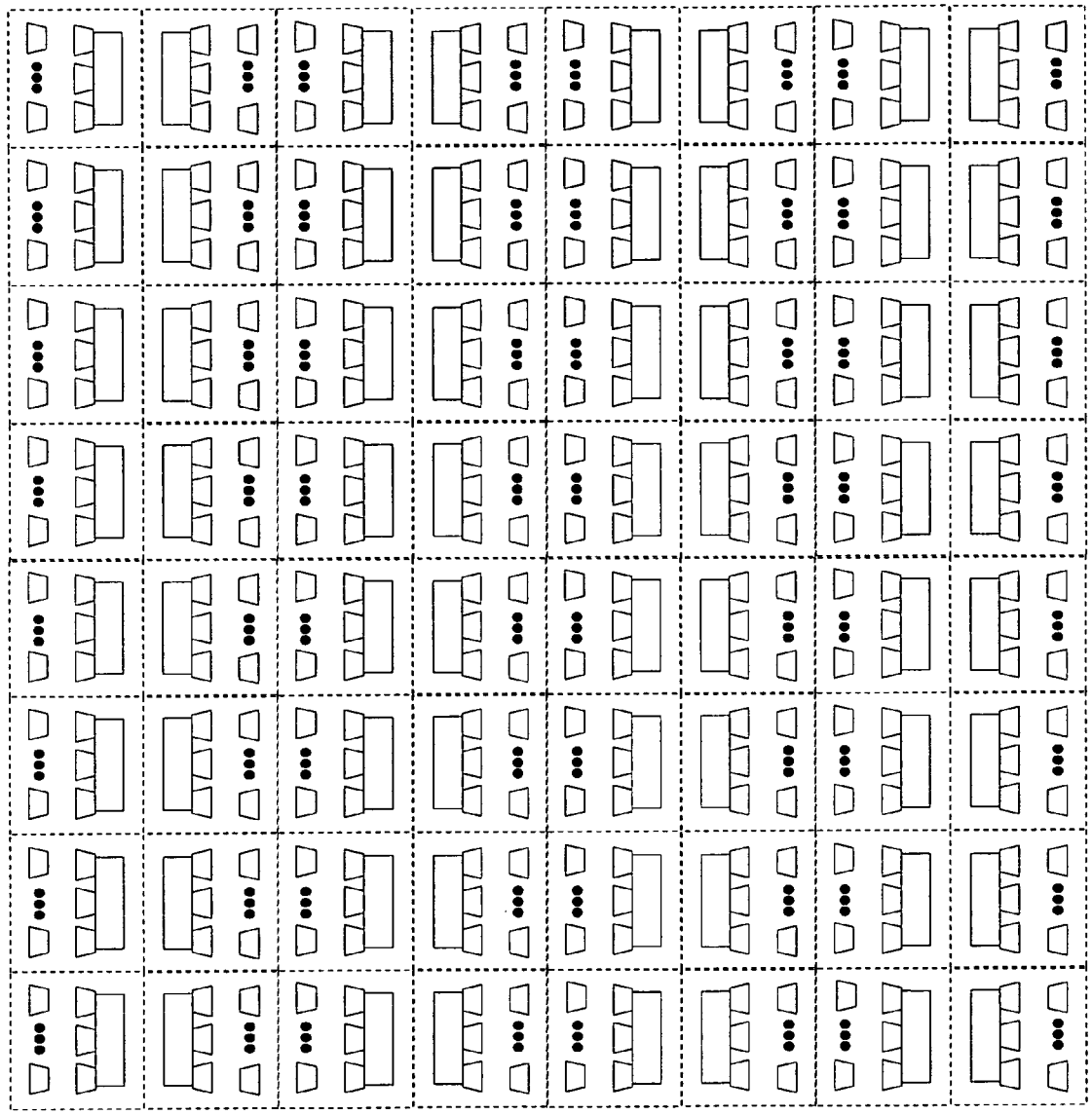
FIG. 7 provides one possible physical architecture of the configurable IC illustrated in FIG. 6.

In some embodiments, the examples illustrated in FIG. 6 represent the actual physical architecture of a configurable IC. However, in other embodiments, the examples presented in FIG. 6 topologically illustrate the architecture of a configurable IC (i.e., they show arrangement of tiles, without specifying a particular position of the circuits). In some embodiments, the position and orientation of the circuits in the actual physical architecture of a configurable IC is different from the position and orientation of the circuits in the topological architecture of the configurable IC. Accordingly, in these embodiments, the IC's physical architecture appears quite different from its topological architecture. For example, FIG. 7 provides one possible physical architecture of the configurable IC 600 illustrated in FIG. 6. In FIG. 7, sets of four tiles are aligned so that their LUT's are placed closer to each other. The aligned set of four tiles can be conceptually viewed as simply another tile itself.

FIGS. 6 and 7 illustrate only configurable non-edge logic tiles. The configurable IC of some embodiments includes other types of configurable tiles, such as configurable edge logic tiles ("edge tiles") and configurable memory tiles. In some of these embodiments, configurable edge tiles are similar to the configurable non-edge logic tiles of FIG. 6, except that configurable edge tiles have additional configurable routing circuits for routing input and output data to and from the circuits in the configurable tile arrangement illustrated in FIGS. 6 and 7.

Figure 8:
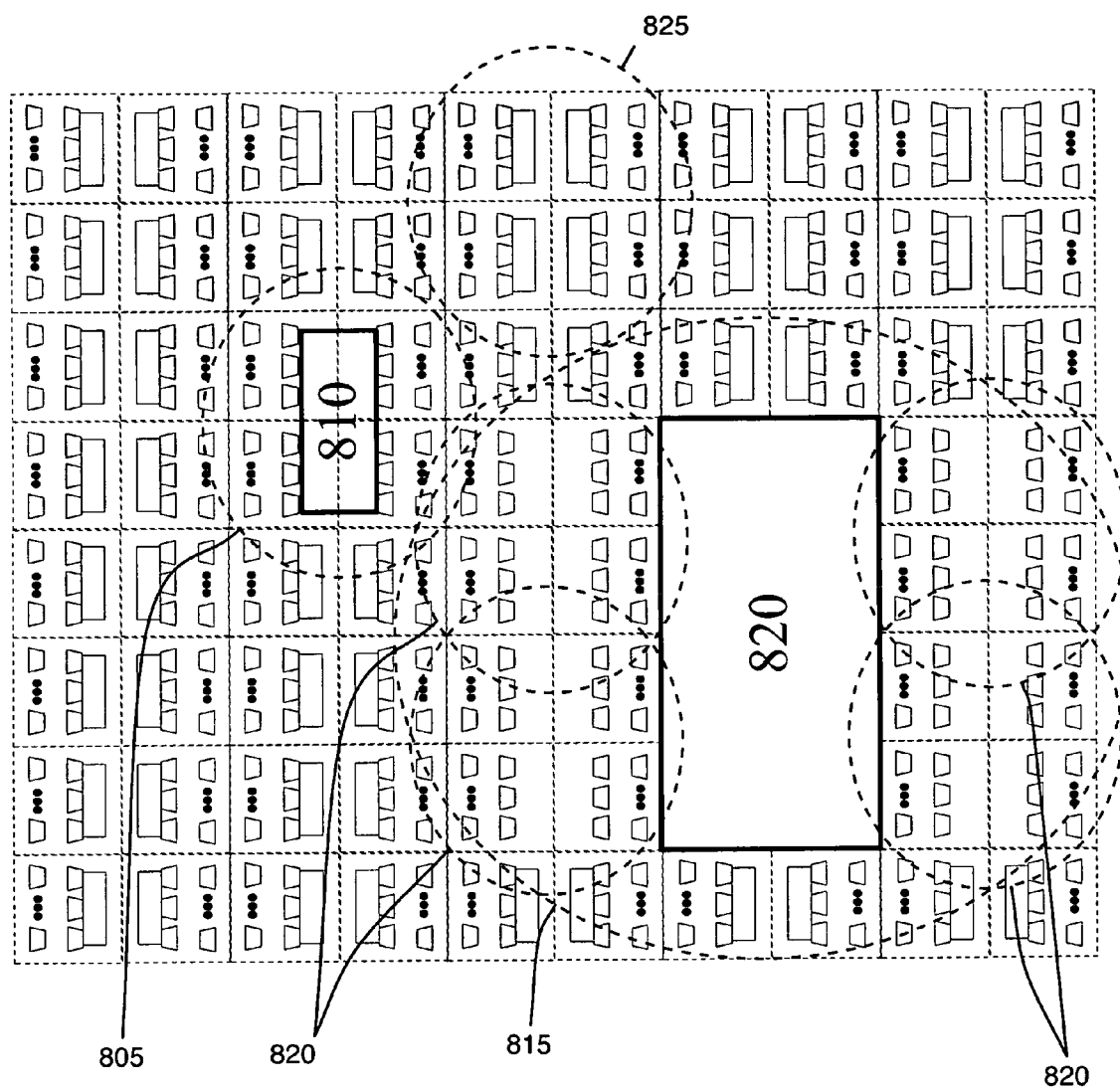
FIG. 8 illustrates two examples of configurable memory tiles.

On the other hand, configurable memory tiles (1) are tiles with blocks of memory, or (2) are tiles that are adjacent to blocks of memory. FIG. 8 illustrates two examples of configurable memory tiles. The first example is a memory tile 805 that is formed by a set of four aligned tiles that have a memory block 810 in place of their four LUT's. In the second example, four aligned tiles 820 (which are formed by sixteen tiles 815) neighbor a memory block 820. In the four aligned tiles 805 and 820, the input select and routing interconnects serve as configurable ports of the memory blocks. In addition to the four aligned tiles 805 and 820, FIG. 8 illustrates several aligned sets of four logic tiles 825, which are similar to the four aligned logic tiles of FIG. 7.

Even though FIG. 8 illustrates a particular tile architecture, one of ordinary skill will realize that other embodiments might use different tile architectures. For instance, the architecture of some embodiments includes at least one memory array similar to the memory array 820, except that the array of these embodiments is surrounded by eight aligned tiles 820, four on each side of the array. Also, some embodiments have a different number of routing or input-select multiplexers. Some embodiments have different types of interconnect and/or logic circuits.

III. Packet Data Structure

Figure 9:
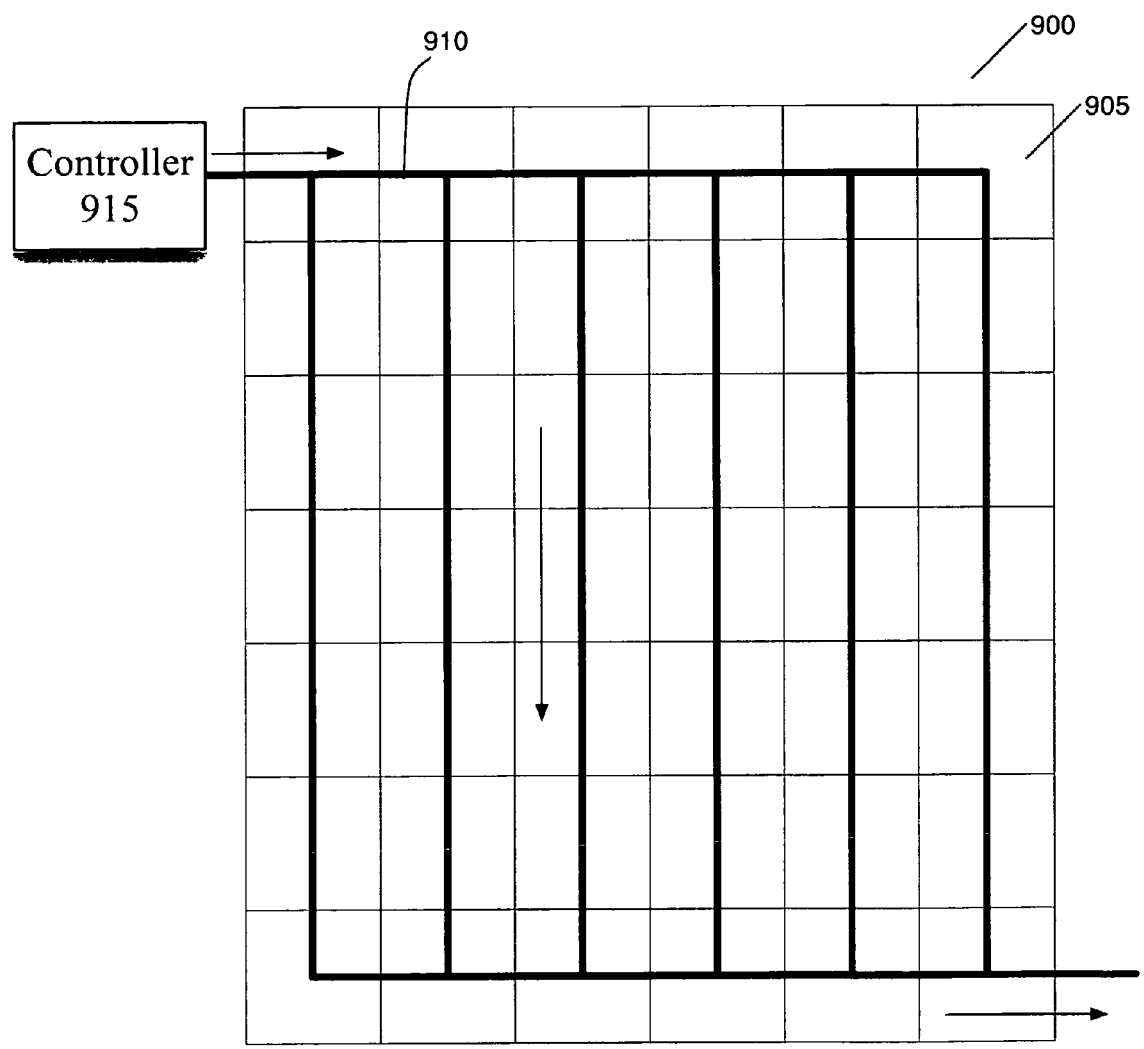
FIG. 9 illustrates a configuration/debug controller that formulates configuration/debug packets that are used to specify the operation of the configurable tiles of a configurable IC during configuration/debug operations.

Some embodiments use a configuration/debug controller to formulate configuration/debug packets, which are then routed to the configurable tiles of a configurable IC during configuration/debug operations. FIG. 9 illustrates one such controller 910. This controller 915 formulates configuration/debug packets and routes such packets to the configurable tiles 905 over a set of lines 910 that traverse each configurable tiles in a tile arrangement 900. The controller formulates configuration/debug packets at a fast rate in some embodiments. In some embodiments, each tile 905 in FIG. 9 corresponds to an aligned set of four tiles illustrated in FIG. 8.

In some embodiments, the set of lines 910 includes eighteen lines, six of which are used to provide control signals, and twelve are used to provide data signals. The six control signals serve as an opcode (operation code), while the twelve signals serve as the operand (i.e., data argument) associated with the opcode. Accordingly, the six lines are referred to below as the opcode lines while the twelve lines are referred to as the operand lines.

As mentioned above, some embodiments use a packet switching technology to route data to and from the resources in the configurable tiles. Hence, over the eighteen lines that traverse through each set of tiles, these embodiments can route variable length data packets to configurable tiles sequential, randomly, or based on tile types (including a global tile type).

Figure 10:
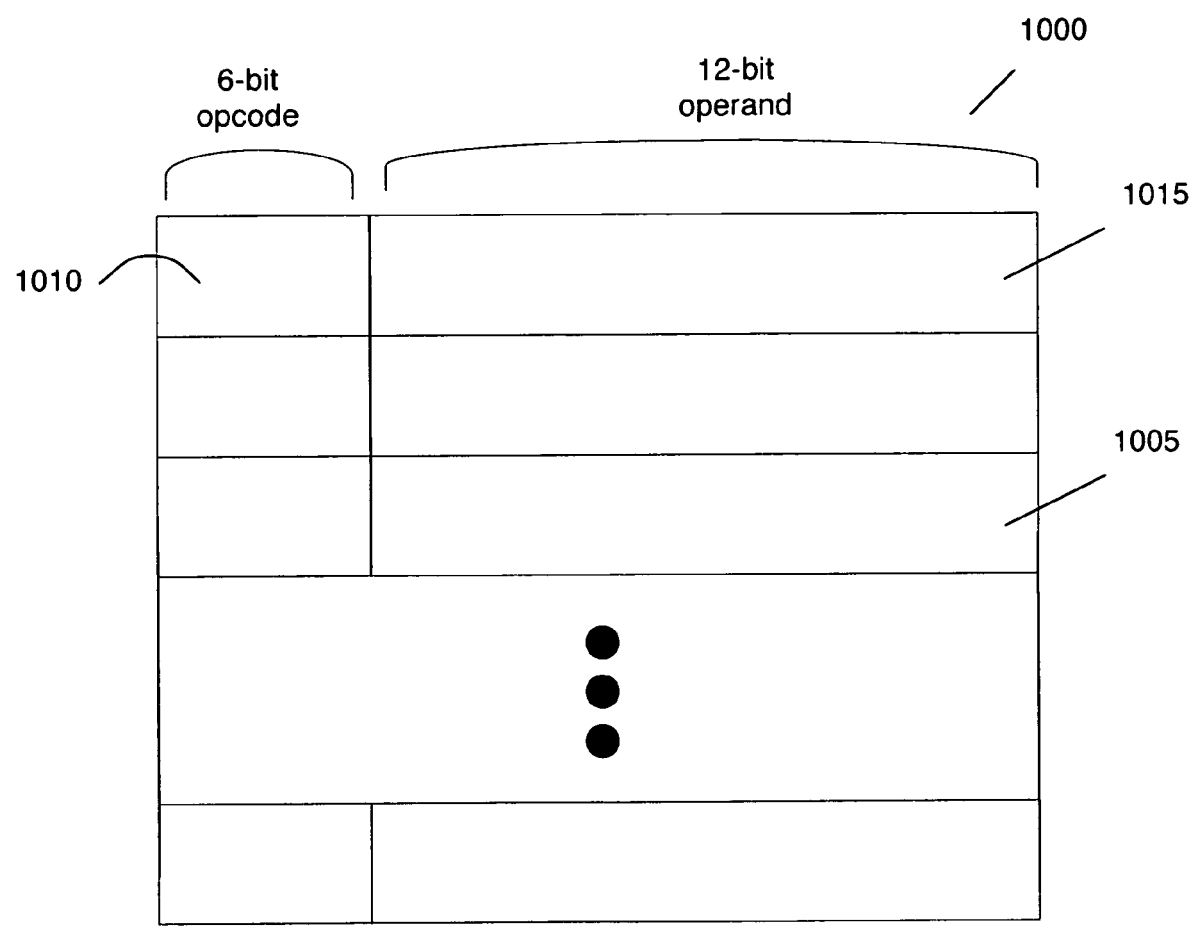
FIG. 10 illustrates an example of a data packet that can be routed to one or more configurable tile sets.

FIG. 10 illustrates an example of a data packet 1000 that can be routed to one or more configurable tile sets. As shown in this figure, the data packet 1000 includes several frames 1005. Each frame has a six-bit opcode 1010 and a twelve-bit operand 1015. In some embodiments, different data packets can have different number of frames. In other words, some embodiments allow the configuration/debug network to use variable sized packets.

Figure 11:
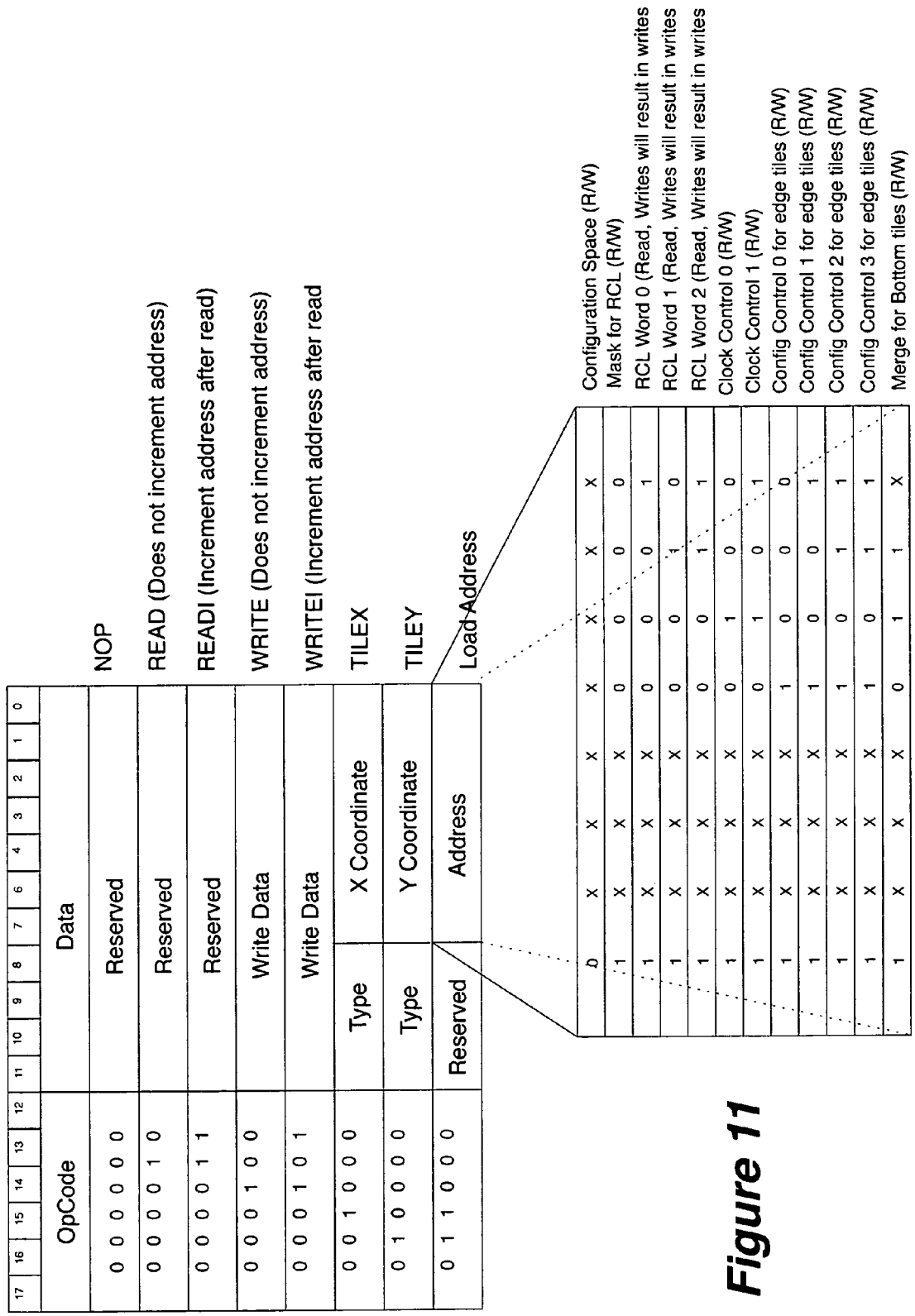
FIG. 11 illustrates examples of some opcodes that are used in some embodiments.

FIG. 11 illustrates examples of some opcodes that are used in some embodiments. These opcodes include:

(1) tile X, which has its lower eight bits identify the column associated with a tile and its higher four bits identify a tile type,
(2) tile Y, which has its lower eight bits identify the row associated with a tile and its higher four bits identify a tile type,
(3) Load Address, which provides an address for an addressed tile to load in its loadable address counter,
(4) Read, which directs the addressed tile to provide the output of a particular resource (e.g., storage elements, RCL, etc.) that is identified by the address in the address counter,
(5) Read Increment, which directs the addressed tile to provide the output of a particular resource that is identified by the address in its address counter, and then to increment the address in its address counter,
(6) Write, which directs the addressed tile to write to a particular resource that is identified by the address in the address counter,
(7) Write Increment, which directs the addressed tile to write to a particular resource that is identified by the address in the load address counter, and then to increment the address in its address counter.

As shown in FIG. 11, the least significant eight bits of the operands of the tile X and tile Y opcodes provide the column and row address of a tile. The four most significant bits of these two operands provide the tile types. These four bits provide (1) fourteen specific types, which can be used to collectively access tiles of the same type (e.g., access small memory tiles or large memory tiles for initializing their stored content), (2) one global type, which specifies all of the tiles, and (3) one "No Type Select" type, which specifies that a set of tiles is being individually addressed (i.e., specifies that the set of tiles are being addressed by the least significant eight bits of the tile X or Y operand, as opposed to being addressed based on their types). In some embodiments, the fourteen tile types include a logic tile type, a first memory tile type, a second memory tile type, an edge tile type, etc.

Because of the tile X and tile Y opcodes, the packets can access the tiles during configuration and/or debugging in any random access manner. More generally, the operands of the tile X and Y opcodes allow the configuration/debug network to access sets of tiles individually, globally, or based on their types. By allowing several tiles to be addressed together, the tile type addressing allows simultaneous reads from or writes to resources in several tiles at once. For instance, a tile X frame can specify a global tile type, and this frame can be followed by a tile Y frame that specifies a global tile type or another tile type. These two frames will result in the selection of several tiles, which might be in different rows and columns. Such read and write operations are used during the streaming and broadcasting modes, which are further described below in Sections V and VI.

As shown in FIG. 11, the least significant eight bits of the Load Address frame's operand can provide the address of a set of resources within an addressed set of tiles. Examples of such resources include (1) storage elements that store configuration data, (2) RCLs (i.e., routing multiplexers that can serve as latches), (3) storage elements (e.g., latches and/or registers) that store mode bits that define one or more operational modes of the resources within the set of tiles, and (4) storage elements (e.g., memory cells) of a memory array.

For instance, when the eighth bit of this operand is a zero, the address operand in some embodiments provides the address of a set of storage elements (called configuration cells below) that store configuration data for configurable circuits in the set of addressed tiles. In some embodiments, each set of configuration cells includes twelve configuration cells.

On the other hand, when the eighth bit is a one, the address operand provides the address of (1) up to eight twelve-bit registers, or (2) one of three sets of RCLs. Each twelve-bit register is a set of storage elements that store mode settings. In the example illustrated in FIG. 11, the eight registers that store mode settings include:

(1) a mask storage that stores mask bits for masking the output of the RCLs,
(2) a merge storage that stores merge bits for merging signals on the twelve operand lines that traverse each column of tiles,
(3) for each set of edge tiles, four configuration control storages for storing configuration data related to the programmable inputs/outputs,
(4) two clock storages for storing clock configurations for the set of tiles.

In some embodiments, each one of the three RCL addresses identifies a different set of twelve RCLs in the tiles. However, in some embodiments, different RCL addresses identify different number of RCLs. For instance, two of the addresses for the RCLs identify two sets of twelve RCLs, while a third address for the RCLs identifies a set of four RCLs, in some embodiments.

Some embodiments address small memory blocks by setting a bit in one of the clock control registers. This bit determines if the IC is in a configuration RAM mode (normal mode) or user RAM access mode. If the bit is set, reads and writes to up to 127 addresses associated with the lower seven bits in the address register are directed to locations in a small memory block associated with an addressed tile. Since the clock control registers are not in this range, the bit can be set and unset in either mode.

For larger memory blocks (i.e., memory blocks with more than 128 addresses), a bit is set in the adjacent tile. When this bit is set, the memory tile is in RAM access mode. If necessary, the width of the address register is increased to fully access the RAM. In some embodiments, the control bit is in a different tile, because the clock control register in the memory tile cannot be accessed when in RAM mode.

The Read Increment and Write Increment frames are quite useful in reducing the number of frames routed through the configuration/debug network. This is because these opcodes obviate the need to load a new address after each read or write. Accordingly, when reading or writing several sequential locations on the IC, the Read Increment or Write Increment opcodes cause a set of address counters in a set of addressed tiles to increment to the next address location for the subsequent read or write operation. One example of this will now be described by reference to FIG. 12.

Figure 12:
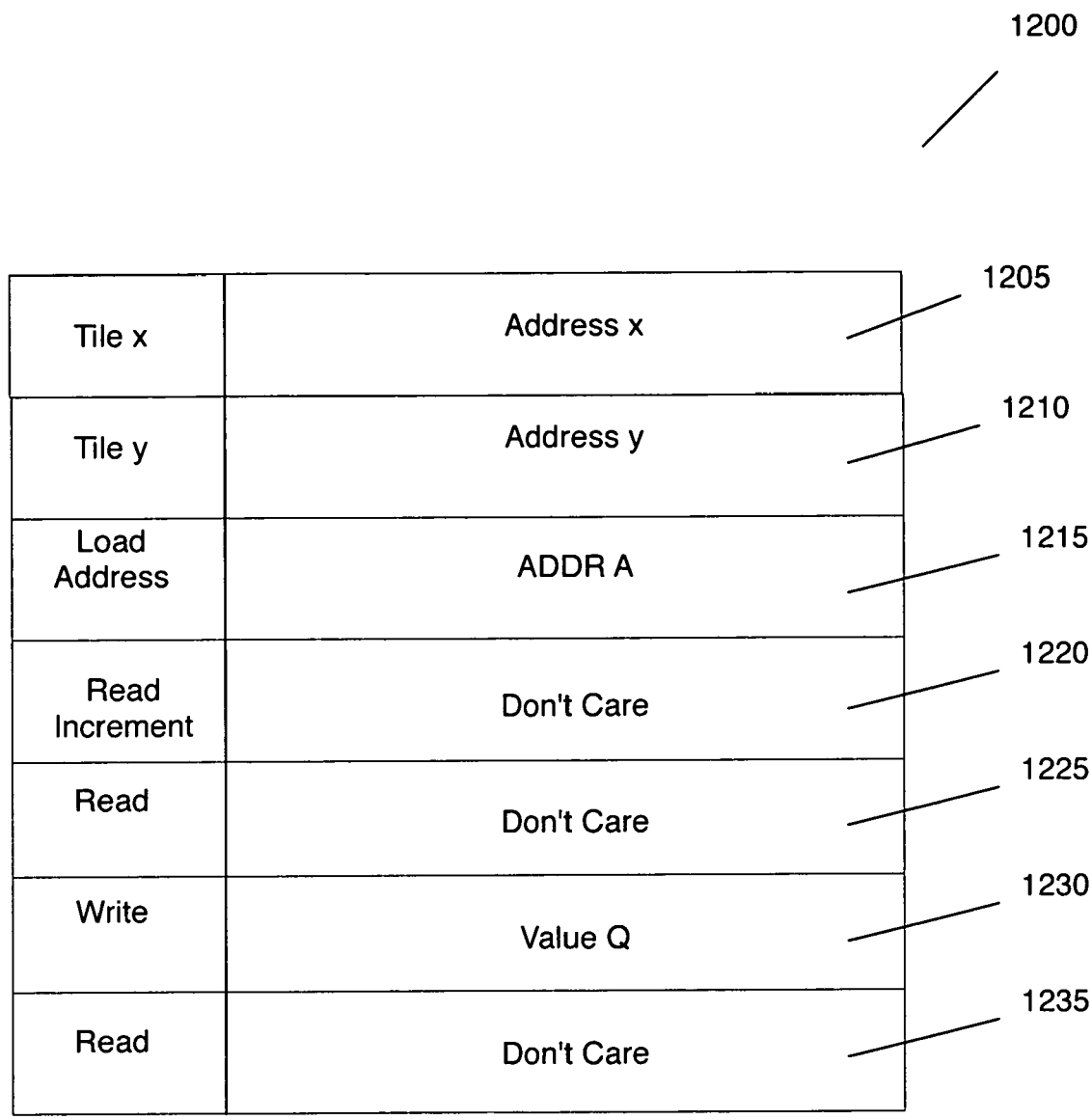
FIGS. 12 and 13 illustrate two examples of packets used to route configuration/debug information over the configuration/debug network of some embodiments.

FIG. 12 illustrates an example of a packet 1200 for a particular tile. As shown in this figure, the packet 1200 includes seven frames. The first frame 1205 specifies the x-coordinate of an addressed tile, the second frame 1210 specifies the y-coordinate of the addressed tile, and the third frame 1215 specifies the address of a set of resources within the addressed tile. The specified address is stored in an address register of the addressed tile in some embodiments. The next four frames 1220-1235 in the packet 1200 then specify a read-increment operation, followed by a read operation, a write operation, and then a final read operation.

The read-increment frame 1220 directs the addressed tile to provide the output value of the set of resources identified by the address (ADDR A in this example) that was previously specified by frame 1215 and that is now stored in its address register. As shown in FIG. 12, the operand in a read frame or read-increment frame is not relevant when the configuration/debug controller prepares such a frame. This is because the operand will be written over during the read operation. In other words, the output of the addressed set of resources is stored in the operand section of the read frame, which like all frames of all packets is routed out of configurable IC after being routed to a particular set of addressed tiles.

The read-increment frame 1220 also directs the addressed tile to increment the address (i.e., ADDR A) in its address register by one after providing the output value of the set of resources addressed by frame 1215. The read frame 1225 then directs the addressed tile to read the output value of the set of resources identified by the incremented address (i.e., ADDR A+1) in the address register. The write frame 1230 next directs the addressed tile to store the value (i.e., Value Q) in its operand section in the set of resources located at ADDR A+1. The read frame 1235 then directs the addressed tile to read the output of the set of resources located at ADDR A+1.

Figure 13:
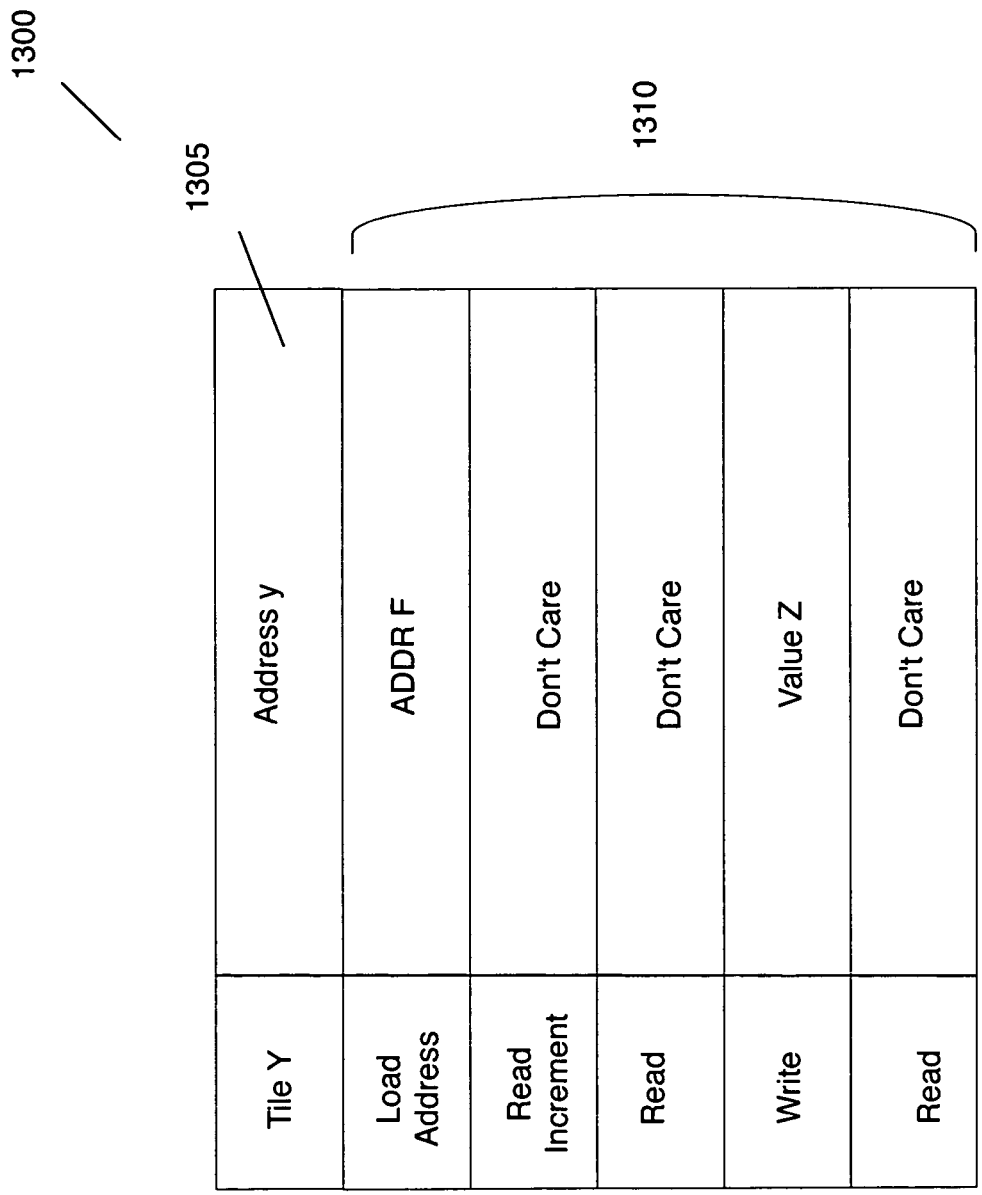

The packet 1200 of FIG. 12 can be followed by another packet for a tile in the same column as the tile addressed by packet 1200. FIG. 13 illustrates such a packet 1300. This other packet does not start with a frame that provides the x-coordinate of an addressed tile, as it is directed to a tile in the same column as tile addressed by packet 1200. Instead, the packet 1300 starts with a frame 1305 that identifies the y-coordinate of the newly addressed tile. This frame 1305 will notify the previously addressed tile that its packet has ended and that the subsequent frames are not intended for it. Also, the newly addressed tile will read the frame 1305 and know that the next set of frames 1310 are intended for it, until it receives a new tile X or tile Y frame.

IV. Network Structure in Each Tile

Figure 14:
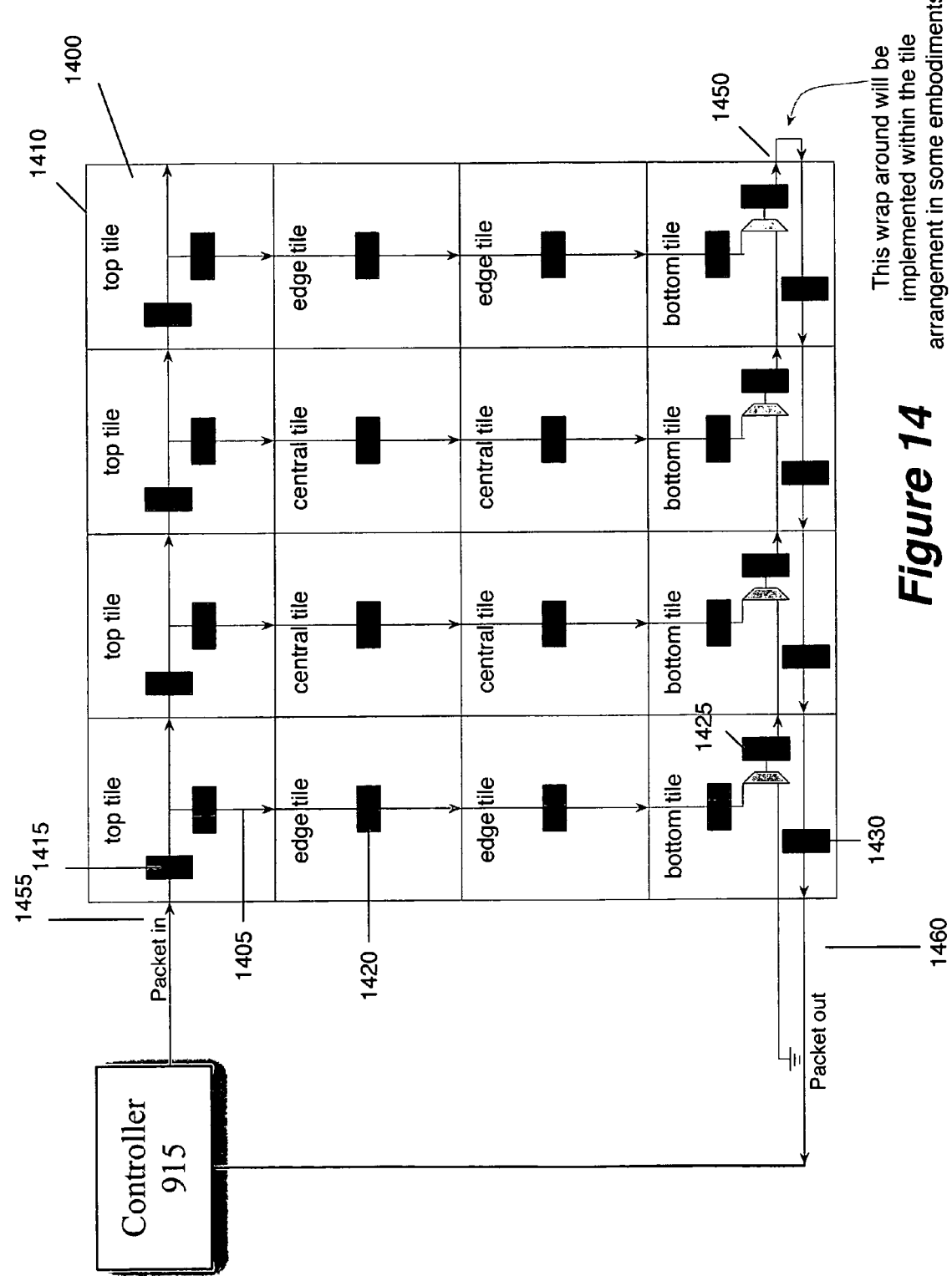
FIG. 14 provides an overview of the configuration and debug network of some embodiments.

FIG. 14 provides an overview of the configuration and debug network 1400 of some embodiments. As shown in this figure, this networks includes an eighteen bit-wide bus 1405 and a configuration/debug controller 915. The eighteen bit-wide bus 1405 passes through each tile of a configurable IC 1410, so that the configuration/debug controller 915 can route configuration/debug packets to the tiles of the configurable IC 1410.

The network 1400 also includes at least one eighteen bit-wide set of storage elements 1415, 1420, 1425, or 1430 in each tile. One such set of storage element exists at the boundary between each horizontally or vertically adjacent tiles. These sets of storage elements store (e.g., latch) the data that they receive for a clock cycle. In some embodiments, each set of storage elements includes eighteen double-edge triggered flip flops, each of which is formed by two multiplexed latches that latch on different edges of the clock. Such a flip-flop is further described in U.S. patent application Ser. No. 11/292,952.

As shown in FIG. 14, the tile array includes four types of tiles, which are: top, edge, central, and bottom. Central and edge tiles have a similar circuit structure in the network 1400, except that edge tiles store more configuration bits as they control the configurable I/Os of the configurable IC 1400 and may contain different programmable resources (e.g., the east/west tiles might contain LUTs, while the north/south tiles might not).

The top tiles have a network circuit structure that allows packets to pass along the top tile row. The top tiles also include the column selection functionality that can route a particular packet down a particular column that is addressed. This column selection functionality routes tile X and tile Y frames down each column as well. The tile X frame is routed down each column as it serves as (1) a column enable signal for each column that contains an addressed tile, and (2) a column disable signal for each column that contained a previously addressed tile. In the configuration/debug network 1400, the tile Y frame also gets routed down each column before the column select circuitry of the particular column can determine that the particular column does not contain the destination (i.e., addressed) tile for the current packet.

The network circuit structure of each tile also includes a tile selection circuit that allows a tile to detect that a packet is addressed to it. In addition, the bottom tiles have a network circuit structure that allows the output of the different columns to be merged into one bus 1450 that traverses from left to right through the bottom tiles, and then loops back through the bottom tiles from right to left to route the configuration/debug packets out of the tile array 1410, as shown in FIG. 14.

The bus 1450 loops horizontally through the bottom tiles, in order to output the configuration/debug packets to the configuration/debug controller 915 from the same side of the tile arrangement 1410 as this controller supplies the packets to the tile arrangement. This simplifies the timing problem for determining when the configuration/debug controller 915 will receive the results of a configuration/debug packet that it sends into the tile arrangement 1410. It allows the controller 915 to send and receive packets at a frequency that is independent on the size of the array. If the height of the array would cause a significant delay for signals output from the bottom of the array to reach the controller at the top of the array, some embodiments might have the bus 1450 to loop back up through the tiles (e.g., through the leftmost tiles) so that it can output data in the same vicinity as the tile arrangement receives input.

In some embodiments, the bus 1450 is wider than eighteen bits wide (i.e., is wider than the eighteen bit column lines whose outputs are merged into the bus at the end of each column). For instance, in some embodiments, this bus is thirty-six bits wide. Alternatively, in some embodiments, this bus is wider in one of its directions (e.g., left to right) than in its other direction (e.g., right to left).

The configuration/debug network 1400 has a fixed latency through each of the tiles. In other words, because of the synchronous set of storage elements at the boundary of each horizontally or vertically aligned tiles, two packets that are addressed to two different tiles have the same delay from the input 1455 to the output 1460 of the tile arrangement 1410. This allows different packets to reach the same tiles without interfering with one another. This guarantees that two different read commands to the same tile do not interfere with each other.

In some embodiments, the configuration/debug network 1400 is completely separate network than the routing fabric network (i.e., the data network) formed by the routing multiplexers and wiring connected to these multiplexers that connects the configurable logic circuits while the IC operates. In other embodiments, the network 1400 shares some wiring and/or interconnect resources with the routing fabric, but includes other resources that it does not share with the routing fabric. Example of resources that the network 1400 does not share in some embodiments includes the configuration/debug bus 1405, and the storage elements 1415, 1420, 1425, and 1430. Examples of routing fabric of wiring and interconnects that connect the configurable logic circuits are disclosed in U.S. patent application Ser. No. 11/082,193.

The network circuit structure in each of the tile types will now be further described in sub-sections A-C.

A. Top Tiles

Figure 15:
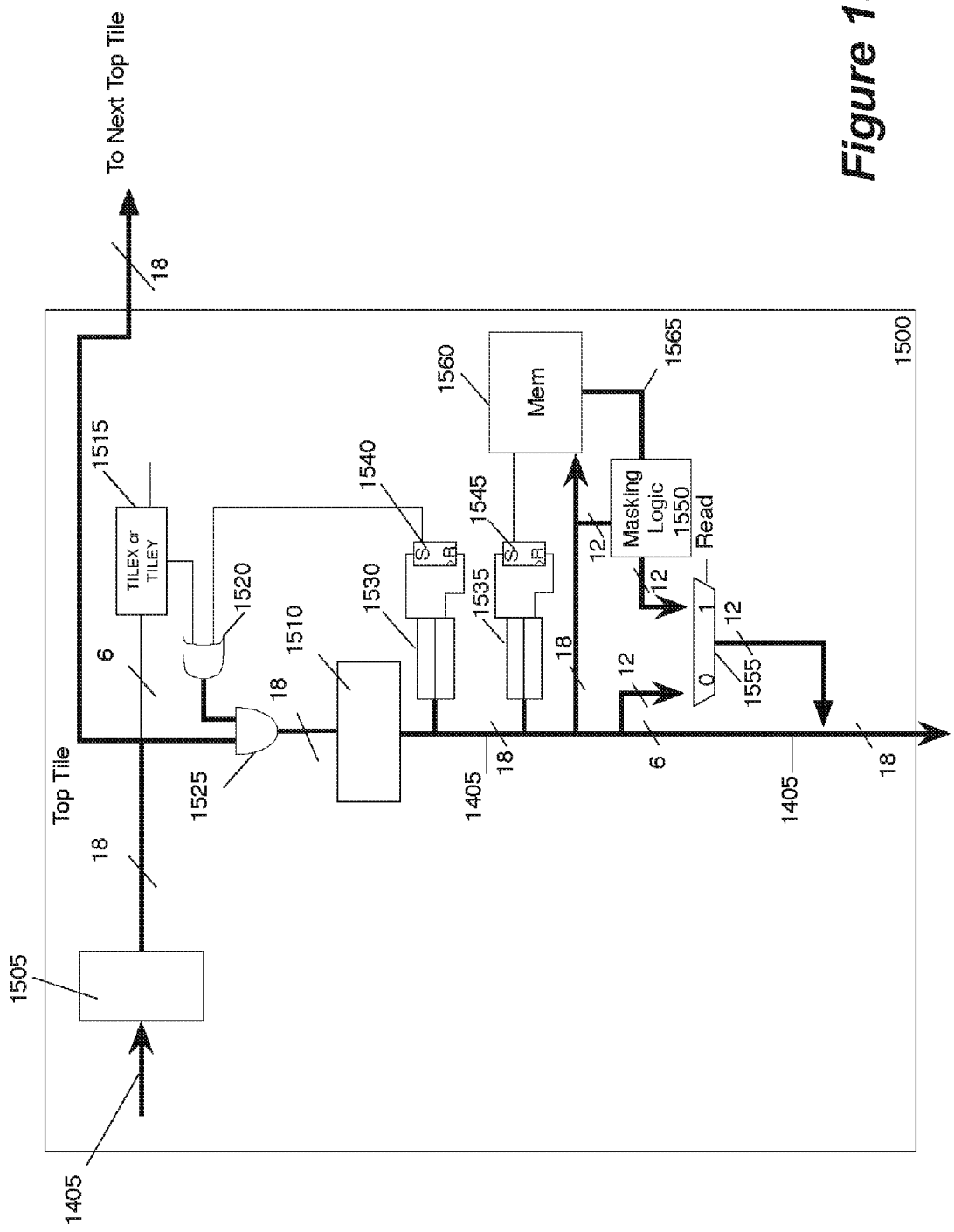
FIG. 15 illustrates the circuits of the configuration/debug network in a top tile.

FIG. 15 illustrates the circuits of the configuration/debug network 1400 in a top tile 1500. As shown in this figure, these circuits include two 18-bit wide sets of storage elements 1505 and 1510, one tile X/tile Y decoder 1515, an OR gate 1520, an AND gate 1525, a column selector 1530, a row selector 1535, two set and reset registers 1540 and 1545, a conceptual memory block 1560, masking logic 1550 and a multiplexer 1555.

As shown in this FIG. 15, the set of storage elements 1505 connects to the 18-bit wide bus 1405 to receive 18-bit packet frames. On each edge of the clock, the set of storage elements stores eighteen bits of data (i.e., a frame) that appears on the bus 1405 and outputs the eighteen bits of data (i.e., the frame) that it latched on the prior clock edge. Each set of eighteen bits (i.e., each frame) that the storage element set 1505 outputs is routed to the next top tile along the eighteen bit wide bus 1405, as shown in FIG. 15. The eighteen bits output from the last top tile are discarded in some embodiments.

The tile X/tile Y decoder 1515 receives the higher six bits of each eighteen bits (i.e., each frame) that is output from the storage element set 1505. This decoder examines these six bits to determine whether these six bits represent a tile X or tile Y opcode. If not, the decoder 1515 outputs a "0".

Alternatively, when the six bit opcode is a tile X or tile Y opcode, the decoder 1510 outputs a "1", which causes the OR gate 1520 to output "1" along its eighteen output lines. These outputs of the OR gate 1520, in turn, allow the eighteen bits that are output from the storage element set 1505 to pass through the eighteen bit-wide AND gate 1525 (i.e., cause the AND gate to output eighteen bits that are identical to the eighteen bits that it receives from the storage element set 1505).

The storage element set 1510 receives the eighteen bit wide output of the AND gate 1525. On the next clock edge, the storage element set 1510 outputs the eighteen bits. The column selector 1530 receives the output of the storage element set 1510. The column selector 1530 determines whether the higher six bits represent a tile X opcode, and if so, whether the operand of the received tile X frame matches the type or the x-address of the tile 1500. As mentioned above, the lower eight bits of a tile X frame provide the x-address (i.e., the column address) of a tile, while its next four bits provide the type of the tile.

The column selector directs the register 1540 to assert a reset signal (i.e., a "0" in this case) when the column selector receives a tile X frame (i.e., the sixteen bits output from the storage 1510) that has an operand that matches neither the type nor the x-address of the tile 1500. On the other hand, when the received frame is a tile X frame with an operand that matches the type or x-address of the tile 1500, the column selector 1530 directs the register 1540 to assert a set signal (i.e., a "1" in this case). A set signal causes the OR gate's outputs to remain high even after the decoder 1510 pulls its output low when this decoder no longer detects a tile X or tile Y opcode (i.e., no longer receives a tile X or tile Y frame). By keeping the OR gate outputs high, the AND gate 1525 continues to route frames down the column of tile 1500, until the time that the column selector 1530 receives a tile X frame whose operand does not match the type or the x-address of the tile 1500. Once column selector receives such a tile X frame, it directs the register 1540 to reset its output (i.e., to output a "0"). At this point, when the tile X/Y decoder does not output a "1", the OR gate 1520 will output a "0" (i.e., will prevent the AND gate 1525 from routing any more frames down the column of tile 1500) until the tile X or Y decoder 1515 detects another tile X or Y frame.

The row selector 1535 also receives the output of the storage 1530. The row selector 1530 determines whether the received frame is a tile Y frame (i.e., whether the higher six bits output from the storage 1530), and if so, whether the operand of the received tile Y frame matches the type or the y-address of the tile 1500. As mentioned above, the lower eight bits of a tile Y frame provide the y-address (i.e., the row address) of a tile, while its next four bits provide the type of the tile.

The row selector directs the register 1545 to assert a reset signal (i.e., a "0" in this case) when it receives a tile Y frame with an operand that matches neither the type nor the y-address of the tile 1500. On the other hand, when the received frame is a tile Y frame with an operand that matches the type or the y-address of the tile 1500, the row selector 1535 directs the register 1545 to assert a set signal (i.e., a "1" in this case). A set signal from the register 1545 activates the decoder logic associated with the conceptual memory block 1560 of the tile 1500, while the reset signal from the register 1545 deactivates this decoder logic.

The conceptual memory block 1560 conceptually represents tile 1500's (1) storage elements that store configuration data, (2) RCLs (i.e., routing multiplexers that can serve as latches), (3) storage elements (e.g., latches and/or registers) that store mode bits that define one or more operational modes of the resources within the tile 1500, and (4) storage elements (e.g., memory cells) in a memory array.

The storage elements and RCLs are not actually organized in a contiguous block in some embodiments. However, in some embodiments, groups of storage elements (e.g., configuration cells), RCLs, and/or registers can be enabled at one time for a read or write operation. For instance, in some embodiments, groups of twelve configuration storage elements, groups of twelve or four RCLs, and groups of twelve one-bit registers can be enabled at one time. The decoder logic for addressing these groups of storage elements and RCLs will be further described below.

The conceptual memory block also receives the eighteen-bit output of the storage 1510 (i.e., connects to the eighteen bit-wide bus 1405 and receives the frame output from the storage 1510). Through this connection, data can be written to the RCLs and storage elements (e.g., configuration, register, and memory cells) in the block 1560.

Figure 16:
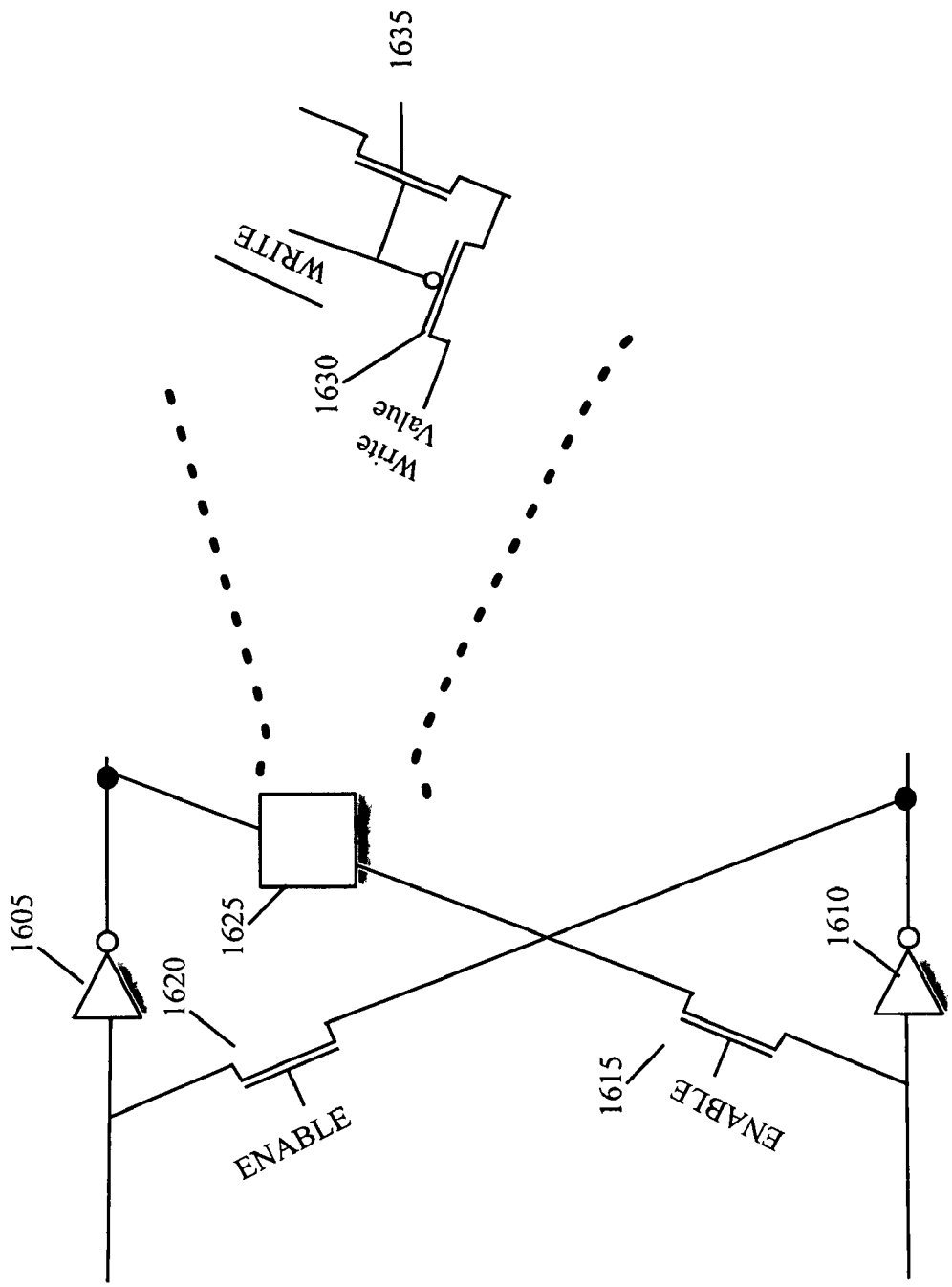
FIG. 16 illustrates how some embodiments write a value into a latch storage element.

U.S. patent application Ser. No. 11/081,859 discloses the RCL design of some embodiments of the invention. As disclosed in this application, each RCL is an n-to-one multiplexer (where n is any integer greater than 1) that has a complementary pass logic design. As shown in FIG. 16, this multiplexer also has two output buffers 1605 and 1610 that are cross coupled by two transistors 1615 and 1620 (i.e., one transistor connects the input of first buffer to the output of the second buffer, while the other transistor connects the input of the second buffer to the output of the first buffer). These two transistors when enabled cause the output stage of the multiplexer to form a latch. To write to such an RCL, some embodiments insert a write-enable circuit 1625 in series with one of the cross-coupling transistors, as shown in FIG. 16. This figure illustrates that in some embodiments the write-enable circuit includes one NMOS transistor 1635 and one PMOS transistor 1630. The NMOS transistor 1635 is in series with one 1615 cross coupling transistor. The PMOS transistor 1630 connects at its drain to the node between the two transistors 1615 and 1635, and connects at its source to the value that needs to be written into the latch. The gates of transistors 1630 and 1635 are both tied to the complement of the Write signal, which is high when a value has to be written into the latch. When the Write signal is high, the transistor 1635 is off, and the transistor 1630 is on to pull the node between the two transistors 1615 and 1635 to the value being written, which in turn places the output of the buffers to the desired values.

Data can be read from (1) the storage elements (e.g., configuration, register, and memory cells), and (2) the RCLs in the block 1560 through n address lines 1565, where n is an integer larger than eleven in some embodiments. These lines are fed to a multiplexer 1555 through the masking logic 1550.

The masking logic 1550 also receives the lower twelve-bit output of the storage 1510 (i.e., the bit lines for the frame's operand). The masking logic can replace some of the bits output from the memory block 1560 on lines 1565 with the operand bits being output from storage element 1510. This masking logic, in conjunction with merging logic in the bottom tiles, allows bits to be read from different tiles in potentially different rows and columns at the same time. This masking logic is further described below.

The multiplexer 1555 selects between the potentially masked twelve-bit output from the masking logic 1550 (i.e., the memory-block data path) and the lower twelve-bit output of the storage 1510 (i.e., the packet-frame data path). The multiplexer selects the memory-block data path during a read operation, while it selects the frame-operand data path during a write operation. As mentioned above and further described below, the data from the frame-operand data path can be introduced through the masking logic into the memory-block data path and output during a read operation. As shown in FIG. 15, the twelve-bit output of the multiplexer 1555 merges with the higher six-bit output of the storage 1510 onto the eighteen-bit bus 1405, which is routed to a tile below the top tile 1500.

Figure 17:
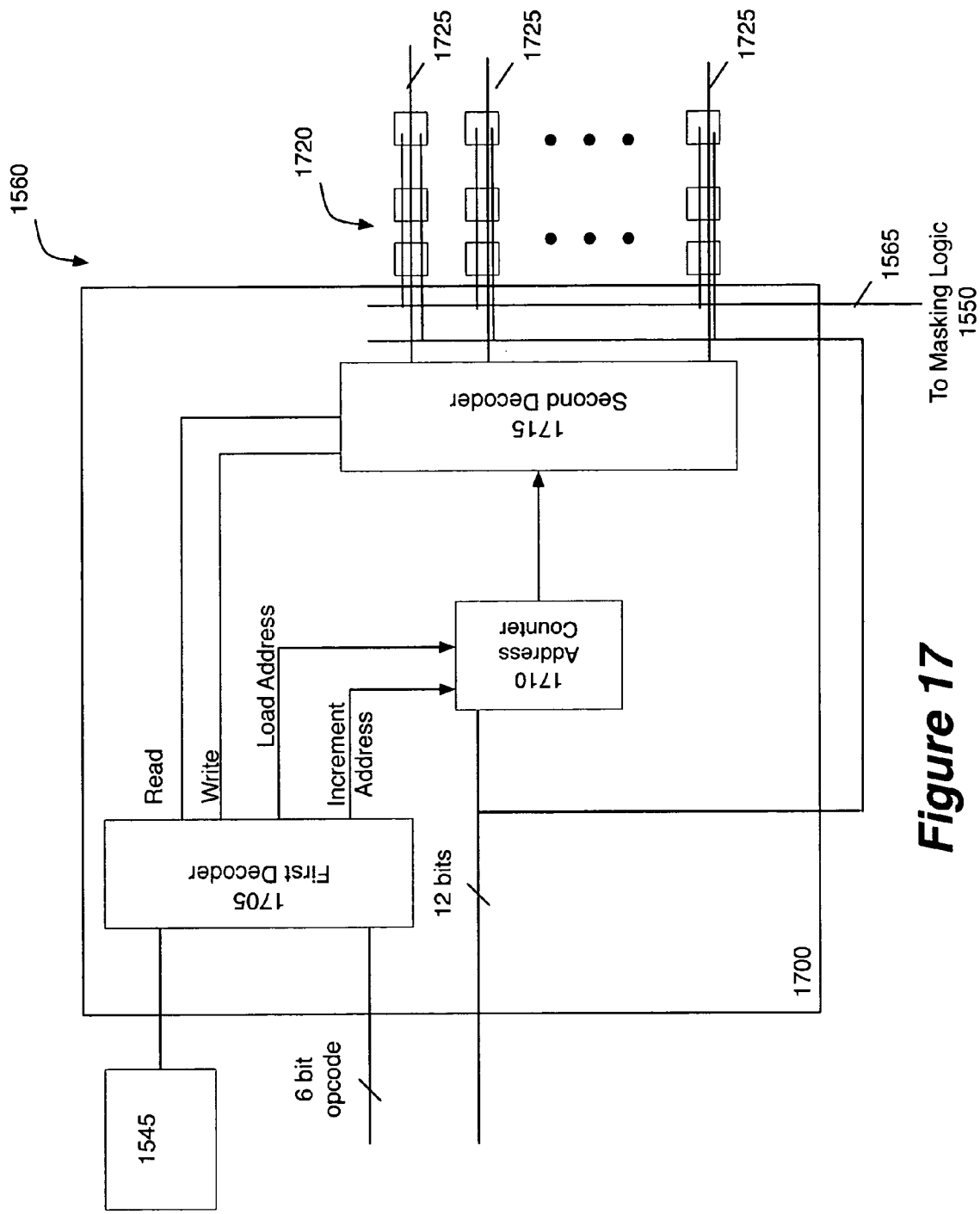
FIG. 17 illustrate the decoder logic of a conceptual memory block for some embodiments of the invention.

FIG. 17 illustrate the decoder logic 1700 of memory block 1560. As shown in this figure, the decoder logic includes two decoders 1705 and 1715 and an address counter. The decoder 1705 receives the output of the set/reset register 1545 and the six bit opcode output (i.e., the opcode of the frame output) from the storage 1510. When the output of the register 1545 is active (i.e., is set), the decoder 1705 decodes the opcode that it receives to determine whether to assert a read signal, a write signal, a load address, and/or an increment address on its output.

The decoder 1705 asserts a read signal when the opcode specifies a read or read increment. It asserts a write signal when the opcode specifies a write or write increment. It asserts a load address when it received a Load Address opcode. It asserts an increment address signal after it receives a Read Increment or Write Increment opcode and it causes a read or write operation to be performed. The load address and increment address signals are supplied to the address counter 1710. The address counter 1710 also receives the twelve-bit operand of the frame output (i.e., within the eighteen bit output) of the storage 1510. When the load address signal is active (i.e., is asserted by the decoder), the address counter loads in the address specified by the twelve-bit operand. Alternatively, when the increment address signal is active, the address counter increments the address that is currently stored in the address counter.

The address counter outputs the address that it stores to the second decoder 1715, which is responsible for enabling a set of blocks 1720 that represent storage elements (e.g., the configuration cells, register cells, memory cells, etc.) and RCLs of the tile 1500. Each address that the decoder block receives can identify up to twelve storage elements (e.g., configuration cells, register cells, memory cells, etc.) or RCLs. As shown in FIG. 17, the decoder 1715 connects the blocks 1720 to several enable lines 1725 that allow the decoder 1715 to enable blocks that are addressed by the address outputted from the address counter 1710. As shown in this figure, one set of blocks 1720 can share one enable line.

FIG. 17 also shows certain blocks 1720 receiving a write signal from the second decoder 1715, which corresponds to the write signal generated from the first decoder 1705. These blocks represent the configuration cells, register cells, memory cells, RCLs, etc. that can store data. When the write signal is active, the twelve bit operand data is written to the blocks enabled by the second decoder 1715. During a read operation, the data from the enabled blocks (i.e., blocks enabled by the second decoder) is written for output onto the output lines 1565 of the memory 1560.

Figure 18:
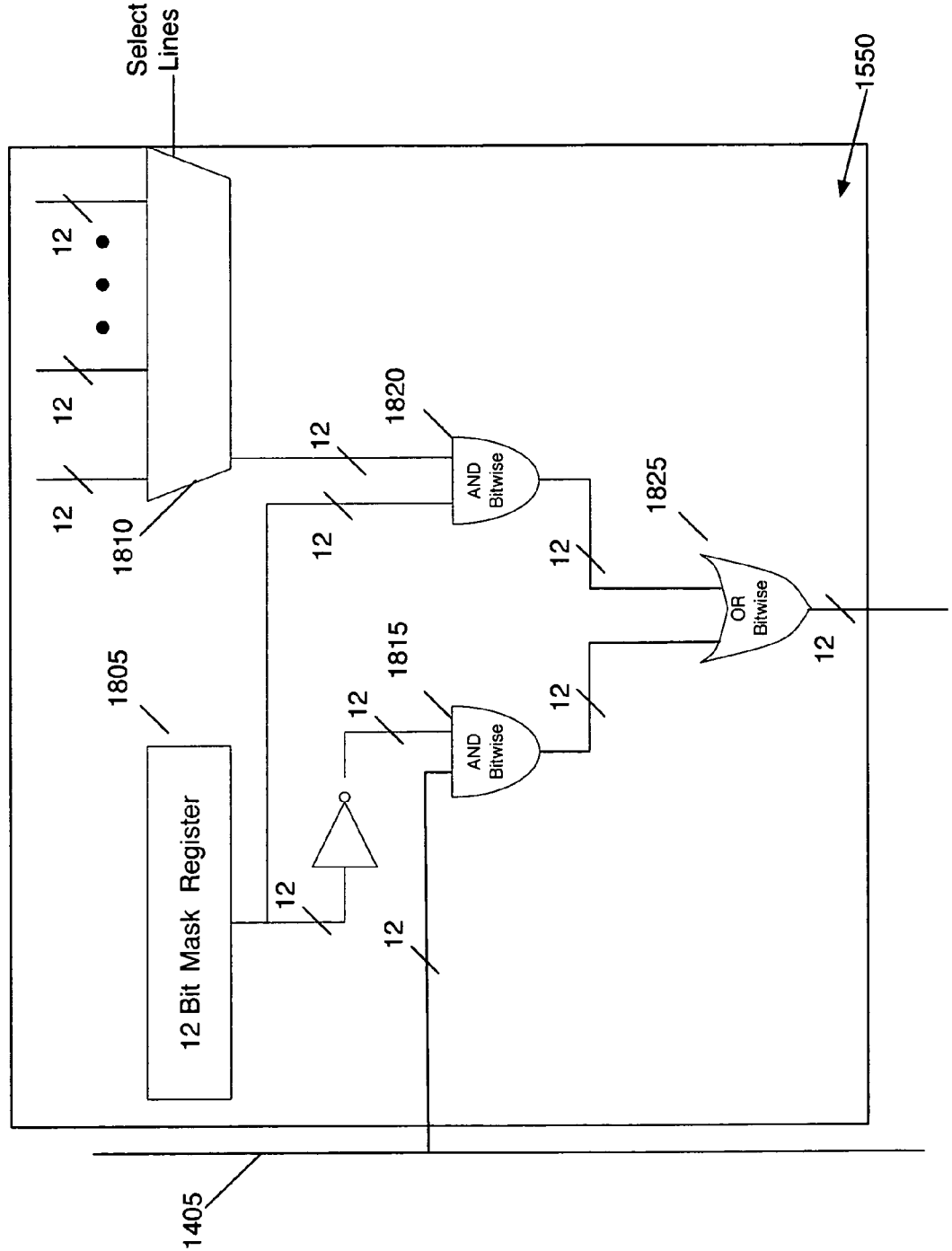
FIG. 18 conceptually illustrates the masking logic of the top tile of some embodiments of the invention.

FIG. 18 conceptually illustrates the masking logic 1550 of the top tile 1500 for some embodiments of the invention. As shown in this figure, the masking logic 1550 includes a mask register 1805, a multiplexer 1810, two AND gates 1815 and 1820, and an OR gate 1825. The multiplexer 1810, the AND gates 1815 and 1820, and the OR gate 1825 are twelve bits wide each.

The multiplexer 1810 receives several sets of twelve output lines. Each set of twelve output lines provides up to twelve outputs from RCLs and storage elements (e.g., configuration cells, register cells, memory cells, etc.) in the conceptual memory block 1560 of the tile 1500. In some embodiments, the masking is performed only for RCL outputs. Hence, in these embodiments, the input sets into the multiplexer 1810 only come from RCLs. However, in these embodiments, another multiplexer is used to circumvent the masking logic when the RCL outputs are not being supplied.

The multiplexer 1810 routes the signal on one of its input sets to the AND gate 1820 based on an address signal that it receives on its select line. This address signal can be generated by the decoder logic 1700. The AND gate 1820 also receives the output of the twelve bit mask register 1805.

The mask register 1805 contains the masking data, which can mask (eliminate) certain data bits output from the memory block 1560 while letting other data bits through. The masking data is written into the mask register before the operation of the masking logic. The output of the masking register is also inverted and then supplied to the AND gate 1815. The AND gate 1815 also receives the operand of the received frame (e.g., for tile 1500, the lower twelve bits output from the storage 1510). The twelve-bit wide outputs of the two AND gates are supplied to the OR gate 1825, which performs an OR function on these two outputs and routes their results to the multiplexer 1555.

When the output of the memory block is not to be masked, the masking register contains all "1's", which results in the AND gate 1820 passing through all the signals output by the multiplexer 1810 and the AND gate 1815 not passing through any of the signals on the bus 1405. On the other hand, when the output of the memory block is to be masked, the masking register contains a particular pattern of "1's" and "0's" that results in the AND gate 1815 and 1820 passing through a desired combination of bits from the bus 1405 and the memory block 1560.

Essentially, the two twelve-bit wide AND gates 1815 and 1820 and the twelve-bit wide OR gate 1825 form a twelve-bit wide two-to-one multiplexer. This multiplexer receives for its two twelve-bit inputs the twelve-bit output of the multiplexer 1810 and the twelve-bit output of the storage 1510. The twelve-bit select lines of this multiplexer receives the output of the twelve-bit mask register. Each mask bit value then selects between the corresponding bit value from the output of the multiplexer 1810 and the corresponding bit value from the output of the storage 1510.

As mentioned above, the output of the OR gate 1825 is supplied to the multiplexer 1555. If the masking logic is not performed for the memory block 1560 in its entirety, a multiplexer is used to determine whether to route the output of the OR gate 1825 or the output of the memory block 1560 to the multiplexer 1555.

Also, as mentioned above, the configuration/debug network of some embodiments is used in a reconfigurable IC (e.g., a sub-cycle reconfigurable IC). In some such embodiments, the mask register 1805 stores different mask values (e.g., different twelve bit mask values) for different reconfiguration cycles (e.g., different sub-cycles) of the reconfigurable IC. In this manner, different masking operations can be performed in different reconfiguration cycles (e.g., different sub-cycles) to maximize the number of bits that are read from different tiles.

Even though the top tile structure was described above by reference to several conceptual examples illustrated in FIGS. 15-18, one of ordinary skill will realize that other embodiments might use different circuits in the top tile. For instance, instead of using the AND gates 1815 and 1820 and the OR gate 1825, some embodiments use an alternative circuit structure to form a two-to-one multiplexer.

Also, FIG. 18 illustrates a multiplexer 1810 to describe conceptually the concept of a multiplexer that selects between various outputs of the memory block 1560. One of ordinary skill will realize that other embodiments might not utilize an actual multiplexer structure, but instead use a tri-state approach. For instance, several different sets of storage elements or RCLs might share a particular set of twelve-bit lines to provide their output. To do this, each set of storage elements or RCLs has a set of tri-stateable driver that outputs their stored value onto the particular set of twelve bit lines. When a set of storage elements or RCLs are not being read, its associated set of drivers are tri-stated. On the other hand, when the set is being read, its associated set of drivers are used to drive the stored values of the set onto the particular set of twelve-bit lines.

B. Center and Edge Tiles

Figure 19:
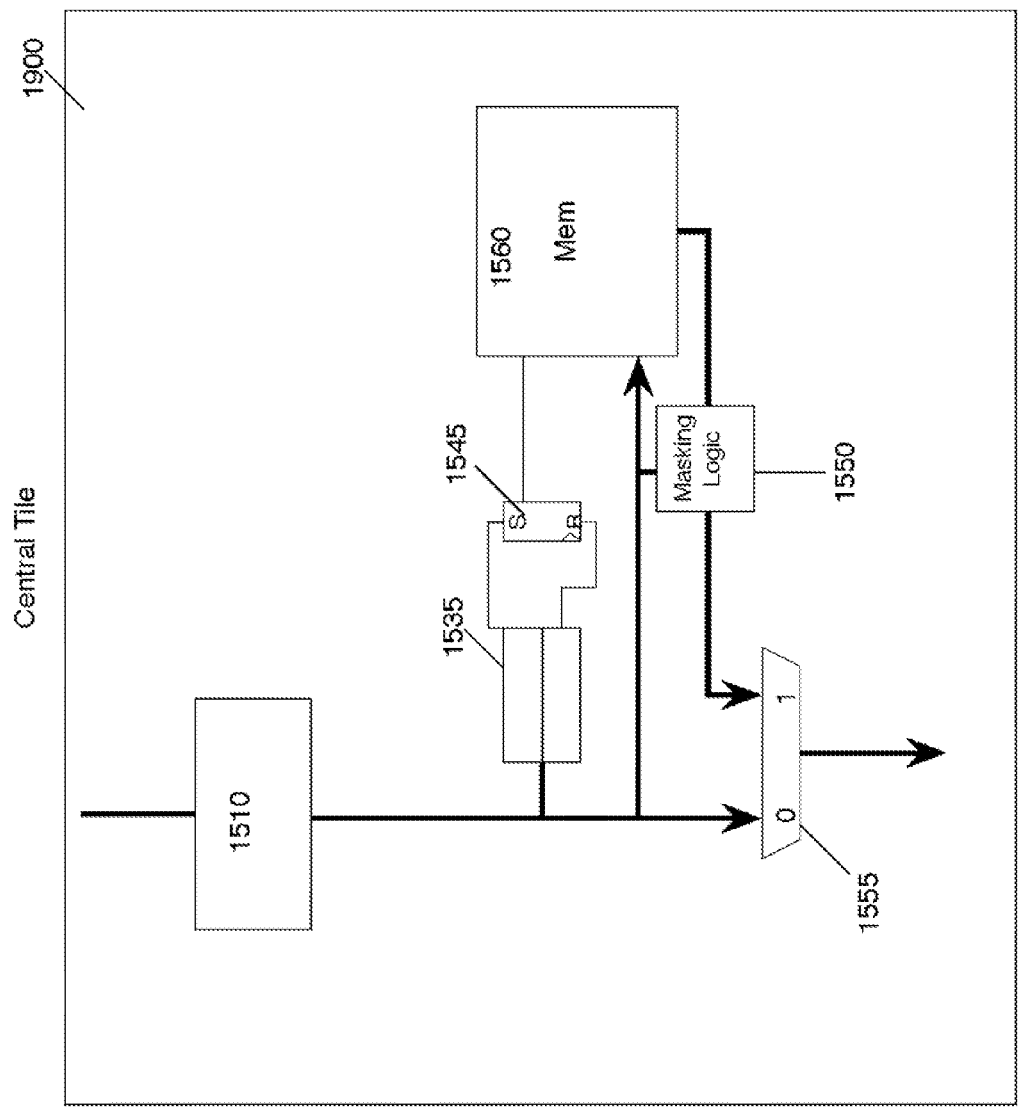
FIG. 19 illustrates the network structure of a center tile in some embodiments of the invention.

FIG. 19 illustrates the network structure of a center tile 1900. As shown in this figure, the network structure of the center tile is identical to the top tile, except that it does not include the storage 1505, the tile X/tile Y decoder 1510, an OR gate 1520, the AND gate 1525, the column selector 1530, the set/reset register 1540. The center tile basically includes all the circuitry necessary for determining whether a packet is intended for it, and if so, to perform the appropriate read, write, and mask operations.

The network structure for an edge tile is similar to the network structure for a center tile. The one difference between edge and center tiles is that, in some embodiments, the edge tiles have more storage elements (e.g., configuration or register cells) to deal with the configurable I/O functionalities of the tile arrangement 1400.

C. Bottom Tiles

Figure 20:
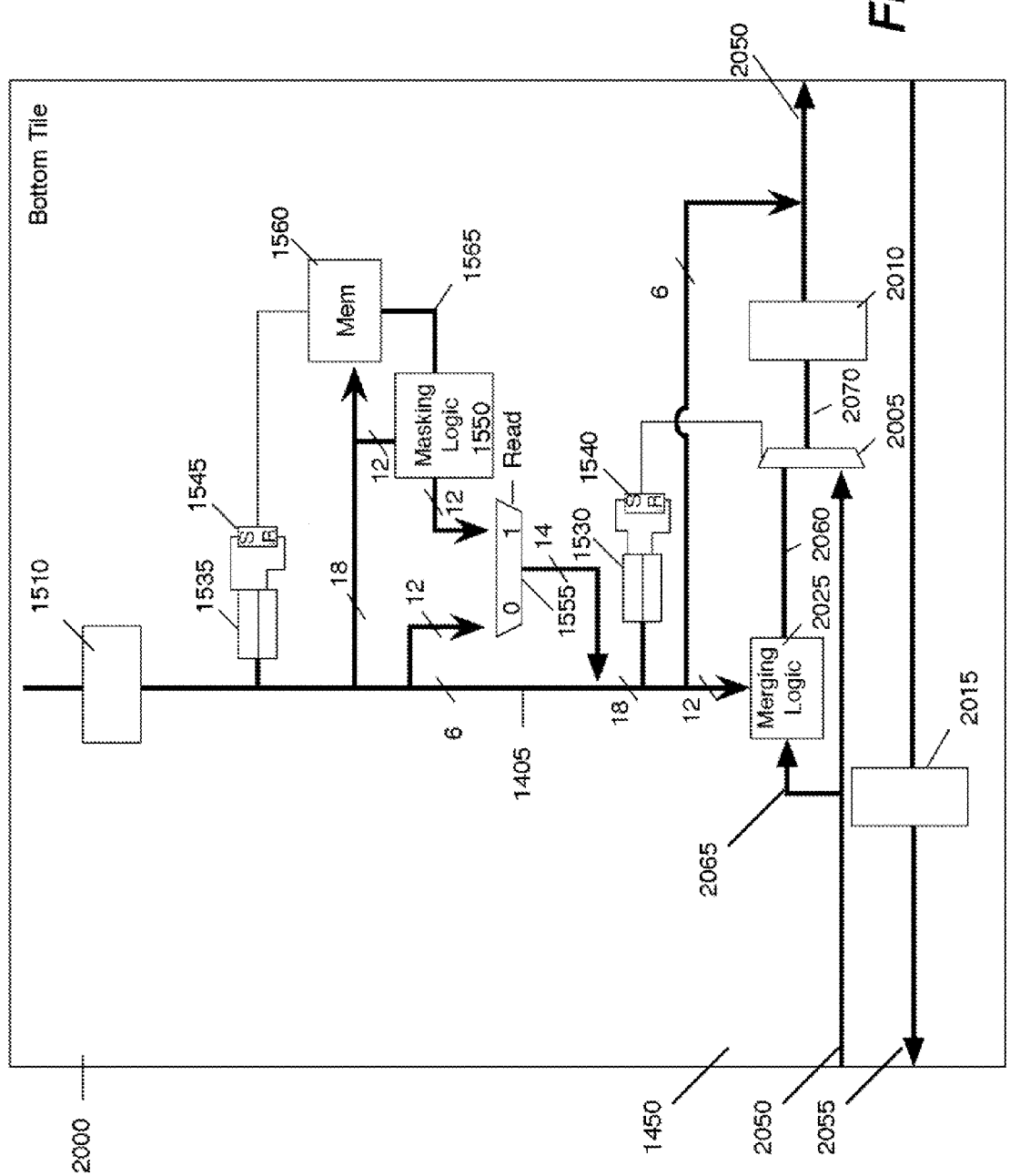
FIG. 20 illustrates the network structure of a bottom tile in some embodiments of the invention.

FIG. 20 illustrates the network structure of a bottom tile 2000. As shown in this figure, the network structure of the bottom tile is similar to the top tile. Like a top tile, a bottom tile includes an 18-bit wide storage 1510, a column selector 1530, a row selector 1535, two set and reset registers 1540 and 1545, a conceptual memory block 1560, masking logic 1550 and a multiplexer 1555. However, it also includes multiplexer 2005, storage elements 2010 and 2015, and a merging circuit 2025. Also, in the embodiment shown in FIG. 20, the column selector 1530 and its associated register 1540 is after the multiplexer 1555 not before. However, in other embodiments, the column selector 1530 and its associated register 1540 can be placed before multiplexer 1555.

The operation of the row selector 1535 and its register 1545 is identical in the bottom, center, and top tiles. The operation of the column selector 1530 and its register 1540 are also similar in the top and bottom tiles. However, in the bottom tile, the column selector 1530 and its register 1540 are used to merge the outputs of multiple columns onto the bus 1450 of the configuration/debug network 1400, as further described below.

The bus 1450 includes two sets of lines 2050 and 2055, the merging logic 2025, and two sets of storage elements (e.g., two registers) 2010 and 2015. The two sets of lines 2050 and 2055 form a horizontal output loop through the bottom tiles. The first set 2050 traverses from left to right, while the second set 2055 traverses from right to left. In a bottom tile 2000 that is not on the left or right edge of the tile arrangement, the first set 2050 routes signals in from a bottom tile to the left of the tile 2000 and route signals out to a bottom tile to the right of the tile 2000, while the second set 2055 route signals in from the bottom tile to the right of tile 2000 and route signals out to the bottom tile to the left of the tile 2000.

In some embodiments, the first set of lines 2050 include thirty-six data lines to allow each of the twelve data lines output from the multiplexer 1555 to be carried on up to three data lines in the set 2050, as further described below. The first set of lines 2050 connects to one set of inputs of the multiplexer 2005, whose set of outputs is supplied to the storage 2010. Thirty-six data lines 2065 from the first set 2050 is also fed to the merging circuit 2025.

The merging circuit 2025 performs an analogous operation to the masking circuit 1550, but it performs this operation to facilitate the merging of the data from the various columns, instead of the tiles from the various rows. Even when the bottom tile is selected, the merging logic can replace some of the bits output from the multiplexer 1555 with the data bits coming from the tile to the left of the bottom tile.

Specifically, the merging circuit 2025 has thirty-six output data lines 2060, each corresponding to a particular data line in the thirty-six data lines 2065 that the circuit 2025 receives. The merging circuit 2025 can place the signal on each output data line of the multiplexer 1555 on up to three of its output data lines 2060. On each particular output data line 2060, the merging circuit 2025 can also place a signal from its corresponding input data line 2065.

The merging circuit 2025 determines the signal to place on an output data line based on a merge bit value, which causes the merge circuit to select between an input data line 2065 and a data line from the output of the multiplexer 1555. In some embodiments that are implemented in a reconfigurable IC, the merge logic includes a merge bit for each output line 2065 for each reconfiguration cycle (e.g., each sub-cycle). Also, to perform the selection between input data lines 2065 and data lines output from the multiplexer 1555, the merging circuit 2025 can utilize a two-to-one multiplexer structure, such as the one formed by the AND gates 1815 and 1820 and the OR gate 1825 of the masking circuit 1550.

The multiplexer 2005 has two sets of input lines and one set of output lines 2070. As one of its sets of input lines, the multiplexer 2005 receives the output lines 2060 of the merging circuit 2025. As its other set of input lines, the multiplexer 2005 receives the first set of lines 2050. As shown in FIG. 14, the multiplexer 2005 of the leftmost bottom tile receives a grounded first set of lines 2050.

The multiplexer 2005 has a select line that receives the output of the set/reset register 1540. When the register 1540 outputs a reset signal (in this case a "0"), the multiplexer selects the first set of lines 2050 for output on its set of output lines 2070 (i.e., routes the signals on the first set of lines 2050 to its output lines 2070). Alternatively, when the register 1540 outputs a set signal (in this case a "1"), the multiplexer selects the output lines 2060 of the merging circuit 2025 for output on its set of output lines 2070 (i.e., routes the signals on the output lines 2060 to its output lines 2070).

The register 1540 assert a reset signal (i.e., a "0" in this case) when the column selector directs it to do so after the selector receives a tile X frame (i.e., receives the eighteen bits output) from the storage 1510 that has an operand that matches neither the type nor the x-address of the tile 2000. On the other hand, when the received frame is a tile X frame with an operand that matches the type or x-address of the tile 2000, the column selector 1530 of tile 2000 directs the register 1540 to assert a set signal (i.e., a "1" in this case).

Accordingly, the multiplexer 2005 selects between the data path coming from the left of the bottom tile 2000 and the potentially masked/merged output of the multiplexer 1555. The multiplexer 2005 selects the packet-frame data path coming from the left side when the bottom tile's column is not selected, while it selects the potentially masked/merged output of the multiplexer 1555 when the bottom tile's column is selected. Through the merging operation of the merging circuit 2025, the data from the data path coming from the left side can be introduced into the data path from the tile's column even when the column is selected. This merging logic, in conjunction with masking logic in the each tiles, allows bits to be read from different tiles in potentially different rows and columns at the same time.

The bottom tile contains two sets of storage elements 2010 and 2015 in its output path. The storage 2010 is in a forward direction out of the bottom tile 2000. This storage is there for retiming the signals at the boundary of two tiles. The other storage 2015 is in the loop back direction through the bottom tile. It also performs retiming at the boundary of two tiles. However, the storage 2015 is primarily used for the loop back through the tile arrangement, which as mentioned above allows configuration/debug packets to be output from the arrangement on the same side that they are input. This allows the controller 915 to send and receive packets at a frequency that is independent on the size of the array. To establish the loop back, the first set of lines 2050, or a portion of these lines, connects to the second set of lines 2055 in the rightmost bottom tile.

V. Broadcasting

The configuration/debug network described above has the ability to write data (e.g., configuration data sets or initialization data) simultaneously to various storage elements (e.g., various configuration cells or memory cells) in various different tiles. This ability is highly advantageous for decreasing the time for configuring configuration cells (i.e., storing configuration data) or initializing memory cells in a configurable IC.

Figure 21:
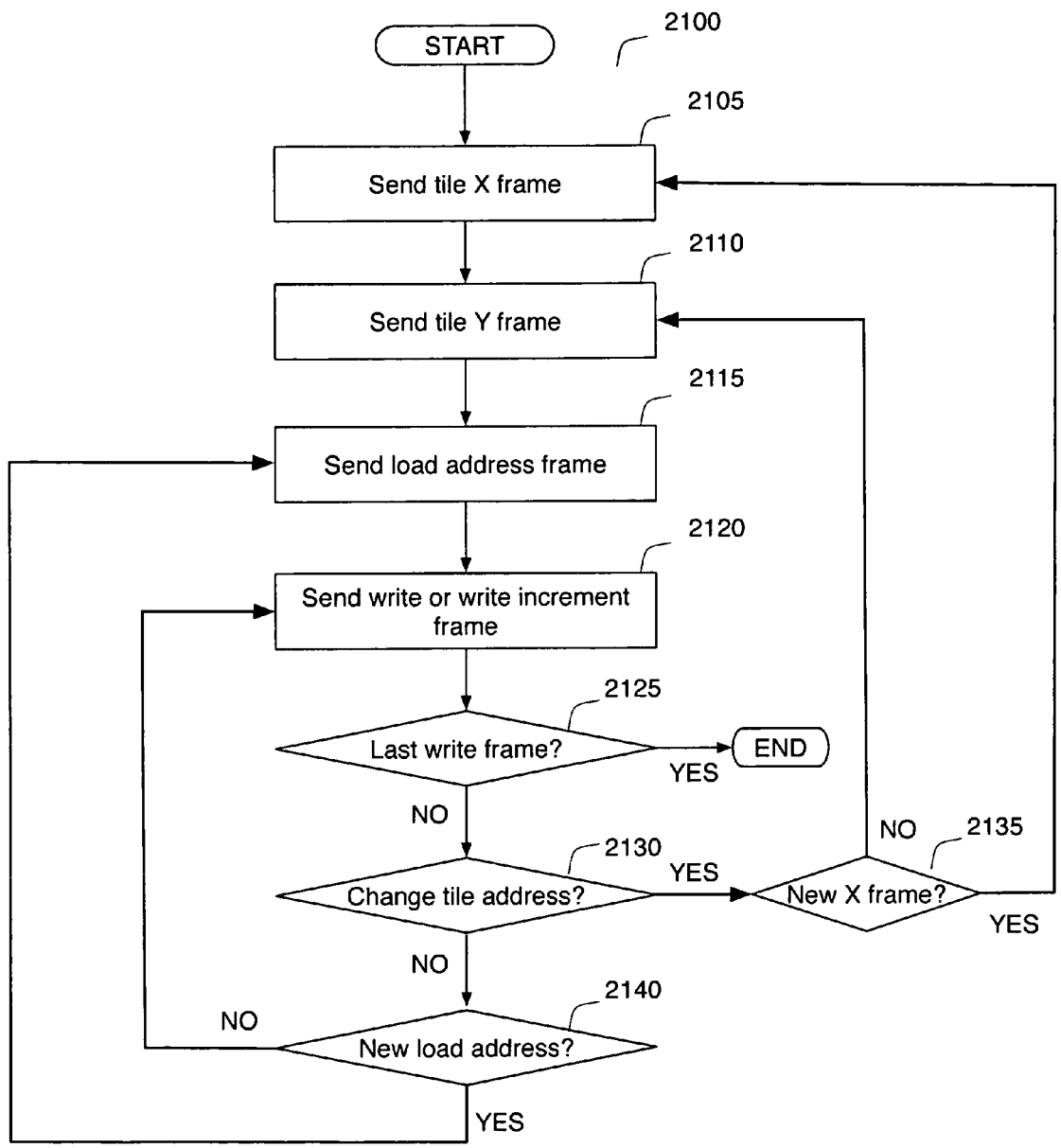
FIG. 21 illustrates a process that the configuration controller can perform to operate the configuration/debug network in a broadcasting mode.

FIG. 21 illustrates a process 2100 that the configuration controller 915 can perform to operate the configuration/debug network in a broadcasting mode. As shown in this figure, the broadcasting process initially sends (at 2105) a tile X opcode that specifies the address (i.e., the x-coordinate or tile type) of all tiles or a subset of tiles. At 2110, the process sends a tile Y opcode that specifies the address (i.e., the y-coordinate or tile type) of all tiles or a subset of tiles. The X and Y opcodes together specify all the tiles or a subset of two or more tiles.

At 2115, the process sends a load address frame that provides an address that the addressed tiles need to store in their address counters. This address is the address of resources within each addressed tile to which data needs to be written. Next, at 2120, the process sends a Write or Write Increment frame that contains twelve bits that the addressed tiles need to store in their resources that are located at the address stored in their address counter. When the Write Increment frame is sent, the addressed tiles increment the address in their address counter after writing to the specified-address After 2120, the process determines (at 2125) whether it has broadcasted all the required Write or Write Increment frames. If so, the process ends. Otherwise, the process determines (at 2130) whether it needs to change the tile address for the next write operation that it needs to broadcast. If so, the process determines (at 2135) whether it needs to change the x-address of the tiles to which it needs to broadcast. If it does, the process returns to 2105 to send out another tile X frame. If it does not need to change the x-address of the addressed tiles, the process returns to 2110 to send out another tile Y frame. From 2105 and 2110, the operation of the process 2100 is as described above.

When the process determines (at 2130) that it does not need to change the tile address, the process transitions to 2140, where it determines whether it needs to load a new address. Typically, the process would not load a new address for the same set of addressed tiles if its previous write operation was a Write Increment operation. If the process determines (at 2140) that it should load a new address, it transitions back to 2115 to send out a new Load Address frame. Otherwise, the process transitions back to 2120 to send another Write or Write Increment frame. From 2115 and 2120, the operation of the process 2100 is as described above.

VI. Streaming

In some embodiments, all UDS elements of the configurable IC are available on the configuration/debug network 1400. Examples of such UDS elements are RCLs, memory cells, and register cells, which connect to the configuration/debug network through the circuit structures illustrated in FIGS. 15-20. As the UDS elements are accessible through the configuration/debug network, this network can be used to access (read from or write to) the UDS elements in any sequential or random access manner. Random access in this context means that the UDS elements can be accessed through the configuration/debug network and the data packets in any order desired by a user or debugger.

Moreover, as the UDS elements are accessible through the configuration/debug network, this network can read out the state (e.g., the value of the RCLs, the memory cells, register cells, etc.) of the configurable IC while the IC is operating. This ability is highly advantageous for performing debugging during the operation of the configurable IC.

In some embodiments, the configuration/debug network has a streaming mode that can direct various resources (e.g., UDS elements) in one or more configurable tiles to stream out their data during the user-design operation of the configurable IC at the user design operating frequency or faster. This streaming data makes the debugging abilities of the configurable IC even more robust as it allows a large amount of computed and configuration data to be output repetitively at a very fast rate.

Figure 22:
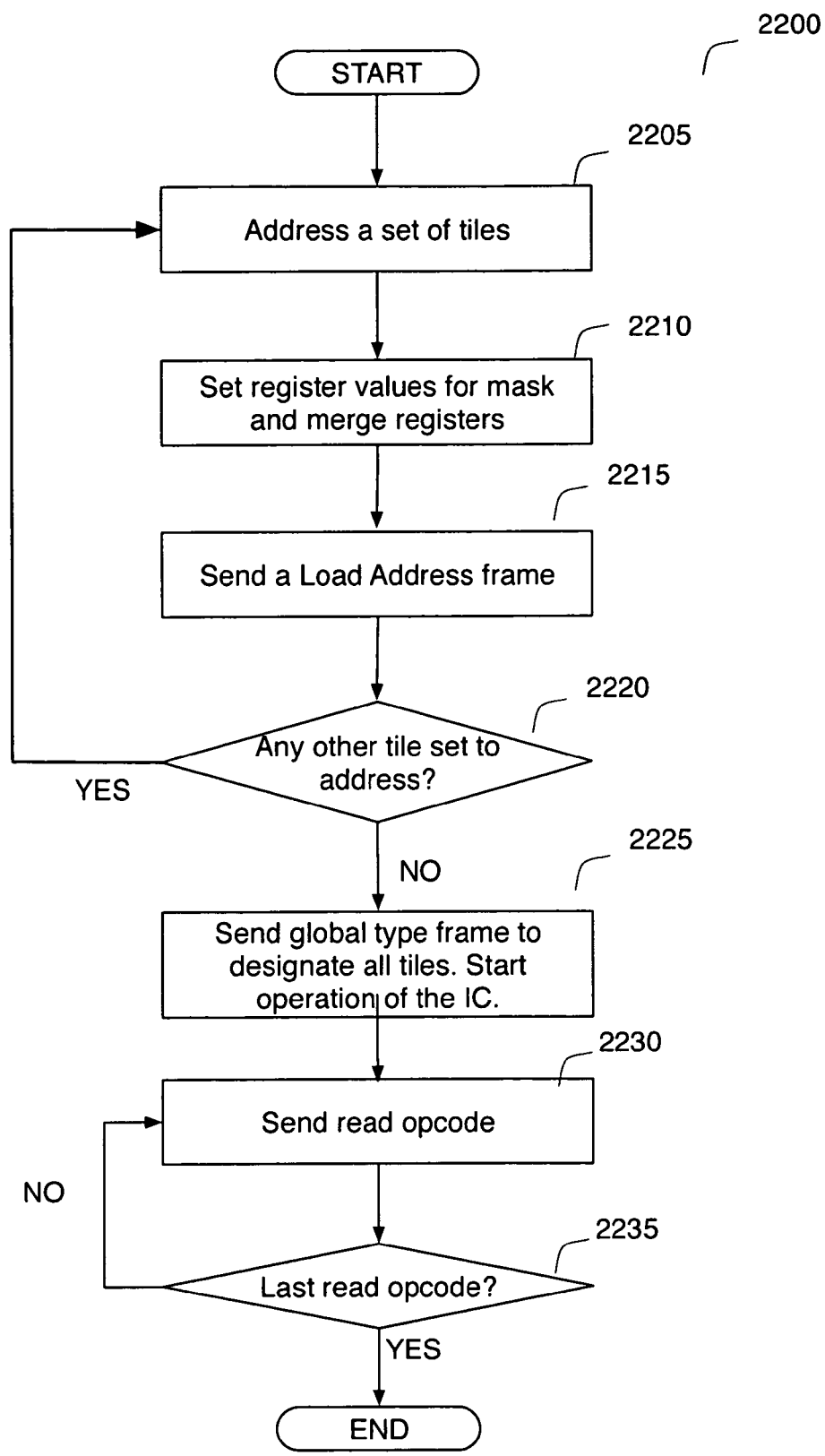
FIG. 22 illustrates a process that the configuration controller can perform to operate the configuration/debug network in a streaming mode.

FIG. 22 illustrates a process 2200 that the configuration controller 915 can perform to operate the configuration/debug network in a streaming mode. As shown in this figure, the streaming process 2200 initially addresses (at 2205) a set of tiles. The process can address such a set by sending a tile X frame followed by a tile Y frame that identify one tile. Alternatively, the process can address a set of two or more tiles by sending a tile X frame that specifies a global type (in order to enable the column selection circuit of each column) followed by a tile Y frame that specifies the tile type or tile address that identify the tile or tiles being addressed.

Next, the process 2200 sets (at 2210) the mask and merge bits in the mask and merge registers of mask and merge logics 1550 and 2025 of the set of tiles addressed at 2205. The mask and/or merge bits mask out the values that are read from the UDS elements of the addressed set of tiles when this set does not include any UDS element whose value has to be streamed out during the streaming operation. Alternatively, when the addressed set of tiles includes a particular set of user-design states that needs to be streamed out, the mask and/or merge bits do not mask out the values that are read from the UDS elements that need to be streamed out.

At 2215, the process then provides a Load Address frame that identifies the resources in the set of addressed tiles (i.e., the set of tiles addressed at 2205) that need be read during the streaming mode operation at 2230 and 2235. The Load Address provides the address (in the set of addressed tiles) of the resources (e.g., UDS elements) that need to be read during the streaming mode. When the set of addressed tiles does not include any UDS elements that are being read during the streaming mode, the Load Address frame can provide the address of any set of resources that need to be masked in the set of addressed tiles.

After 2215, the process determines (at 2220) whether it needs to set the mask and merger register values in any other set of tiles. If so, the process returns to 2205, which was described above. Otherwise, the process notifies (at 2225) all tiles that the subsequent set of read operations are directed to them. In some embodiments, the process so notifies the tiles by sending a tile X frame that specifies a global type (in order to enable the column selection circuit of each column) followed by a tile Y frame that specifies the global tile type. At 2225, the process also starts the user-design operation of the IC. In some embodiments, the user-design operation of the IC, might have been commenced before the process 2200 of FIG. 22 even started. In other words, some embodiments allow tiles to be configured or reconfigured for streaming after the user-design operation of the IC has started. Various definitions for starting the user-design operation of a configurable IC are provided in Section X below.

At 2230, a Read frame is sent, which causes all tiles to read the address locations specified by the addresses that were set at 2215. This read out data is initially stored in the operand field of the Read frame. While outputting this data, the tiles mask and merge logic circuits 1550 and 2025 eliminate the data bits that are supposed to be masked out from the data stream that is streamed out of the tile arrangement. As further described below, the data stream can stream into a trace buffer that is outside of the tile arrangement but on the same IC die, or it can stream into a trace buffer that is outside of the tile arrangement and the IC die. As mentioned above, in some reconfigurable embodiments, the merge register can be set per each bit for each reconfiguration cycle to allow the merging operation to be defined per bit per each reconfiguration cycle, while the mask register can be set per each reconfiguration cycle to allow the masking operation to be defined per each reconfiguration cycle.

After 2230, the process determines (at 2235) whether it needs to continue the streaming mode by sending another Read frame in the next cycle. If so, another Read frame is sent at 2230. In some embodiments, the process 2200 sends Read frames through the configuration network at such a rate to ensure that UDS data streams out of the IC at the user-design operational rate or faster, e.g., at the sub-cycle reconfiguration rate in case of a sub-cycle reconfigurable IC. For instance, in some embodiments, the configurable IC is a reconfigurable IC that operates at 800 MHz to implement a 200 MHz user design with reconfigurable circuits that each loop through four configuration data sets in each user design cycle (i.e., that can reconfigure up to four times in four sub-cycles associated with each user design cycle). In such an embodiment, the process 2200 could send Read frames through the configuration/debug network at a rate of 800 MHz to stream out UDS values at a rate of 800 MHz. In this manner, the monitored UDS values can be streamed out for the four sub-cycles in each user design cycle, which thereby provide the monitored UDS values for each user design cycle. The Read frames are repeatedly sent out until a determination is made (at 2235) that the streaming mode should terminate. At this stage, the streaming process ends.

VII. Trace Buffer and Logic Analyzer

The streaming operation of the configuration/debug network 1400 can be used to create a logic analyzer functionality on the configurable IC. In some embodiments, a logic analyzer has three components: (1) sampling component, (2) a capture component, and (3) a trigger component. The streaming operation can serve as the sampling component of logic analyzer. It can continuously provide samples of certain states of the configurable IC during the IC's operation.

Figure 23:
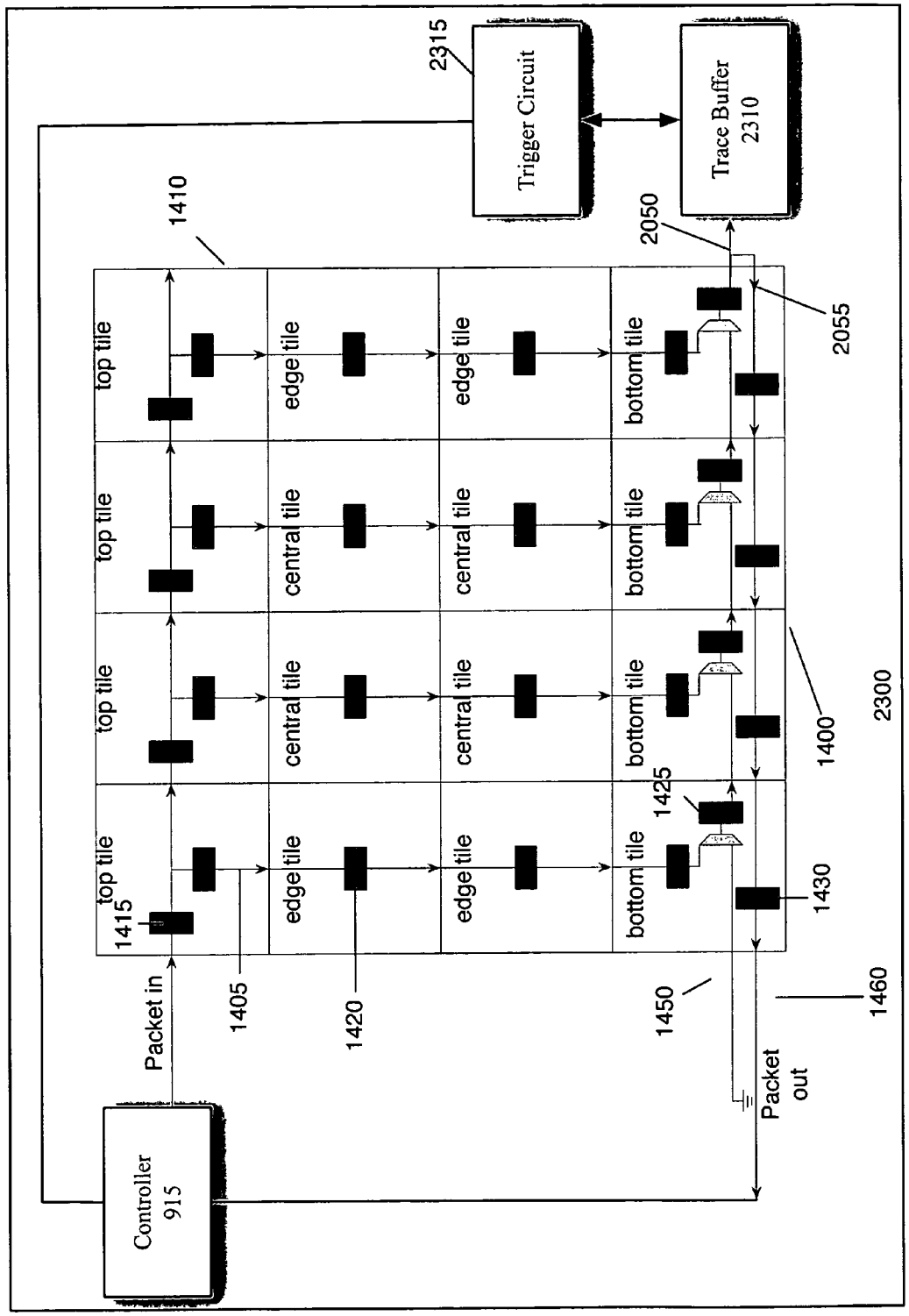
FIG. 23 illustrates an example of a trace buffer according to some embodiments of the invention.

An on-chip trace buffer can perform the capture component of the logic analyzer. FIG. 23 illustrates an example of such a trace buffer 2310. The trace buffer 2310 is on the same configurable IC die 2300 as the tile arrangement 1400 and configuration controller 915. This buffer receives the first set of lines 2050 of the bottom bus 1450 of the configuration/debug network 1400. As mentioned above, the lines 2050 in some embodiments are thirty-six bits wide, which allow the trace buffer to store thirty-six bits of streamed out data from the tile arrangement 1410 on each clock cycle (e.g., each user design cycle). When the tile arrangement is part of a sub-cycle reconfigurable IC, the trace buffer can receive and store thirty-six bits on each sub-cycle of the user design cycle. The trace buffer is a circular buffer that continuously stores the data that it receives until instructed otherwise. When the trace buffer become full while recording, it will continue recording by storing newly received data over the oldest data that it has recorded at the time it receives the new data.

The trigger component of the logic analyzer is performed by a trigger circuit 2315 that communicates with the trace buffer 2310. This trigger circuit 2315 analyzes the data as it is being stored in the trace buffer. When the trigger circuit 2315 identifies a particular set of values or sequence of values that have been stored in the trace buffer, the trigger circuit directs the trace buffer to stop storing the data that is being streamed out of the tile arrangement 1410. In this manner, the trace buffer will store a relevant subset of data that it received for a certain time interval before it stored the trigger-event data that the trigger circuit detected. After stopping the trace buffer's recording, the trigger circuit in some embodiments directs the configuration controller to stop the streaming mode operation of the tile arrangement (e.g., to stop sending Read frames).

Figure 24:
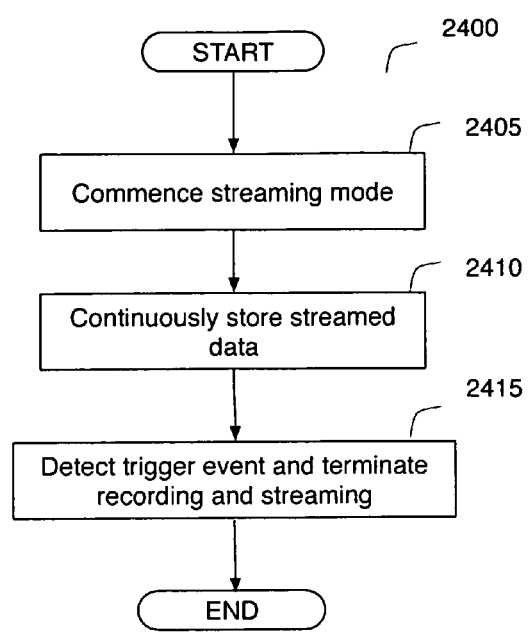
FIG. 24 conceptually illustrates the logic analyzer functionality of some embodiments of the invention.

FIG. 24 illustrates a logic analyzer process performed by the IC 2300 of some embodiments. As shown in this figure, this process initially starts (at 2405) the streaming mode operation of the IC. To do this, the process 2400 runs the process 2200 of FIG. 22. Next, the process continuously stores (at 2410) in the trace buffer 2310 the data being streamed out of the tile arrangement on lines 2050. Finally, the process 2400 terminates (at 2415) the recording when the trigger circuit detects the trigger event while it is continuously analyzing the data stored in the trace buffer. At 2415, the process also directs the configuration controller to terminate the streaming mode operation. At 2415, the process might also set a flag or generates a signal that signifies the detection of the trigger event. This flag or signal is used in some embodiments to interrupt the operation of the configurable IC so that an external circuit can note and analyze the trigger event. Alternatively, this flag or signal does not result in the interruption of the operation of the configurable IC, but serves to simply notify a user or another circuit of the need to analyze or output the data in the trace buffer at a later time.

The logic analyzer functionality of the configurable IC 2300 of FIG. 23 is unique. Existing configurable ICs cannot implement a logic analyzer functionality without altering the user's design. For instance, other configurable ICs take the RTL (register transfer language) description of the user's design and the RTL of a logic analyzer, and define a configuration bit stream that configures the configurable IC to implement the combined design and logic analyzer RTLs. This requires the design to be changed. Also, if the right internal nodes were not picked for tracking, a new configuration bit stream needs to be generated to factor a new RTL for the logic analyzer (which now examines different nodes) and the configurable IC has to be configured again (if possible) with the new configuration bit stream. The configurable IC 2300 does not need configuration data to be generated to implement the logic analyzer functionality, as its logic analyzer functionality is built into the configuration/debug network. In addition, the nodes that are analyzed for the logic analyzer functionality in the configurable IC 2300 can be easily modified by repeating the process 2200 and modifying (at 2215 of the process 2200 of FIG. 22) the resources that stream out their outputs.

FIG. 24 conceptually illustrates the logic analyzer functionality of some embodiments of the invention. Other embodiments might implement this functionality differently. For instance, FIG. 24 illustrates a process where the detection of the trigger event terminates the recording of the UDS data. In other embodiments, however, the detection of the trigger event starts the recording of the UDS data for a particular interval of time or until the occurrence of another trigger event. Also, in some embodiments, the occurrence of the trigger event does not automatically start or stop the recording of the UDS values. Instead, after the trigger even occurs in these embodiments, the recording of the UDS values starts or stops only if certain operational condition exists (i.e., only under certain operational conditions). For instance, in some embodiments, the trigger event will cause the recording to start or stop if a write signal is present on a particular bus that is being monitored.

Figure 25:
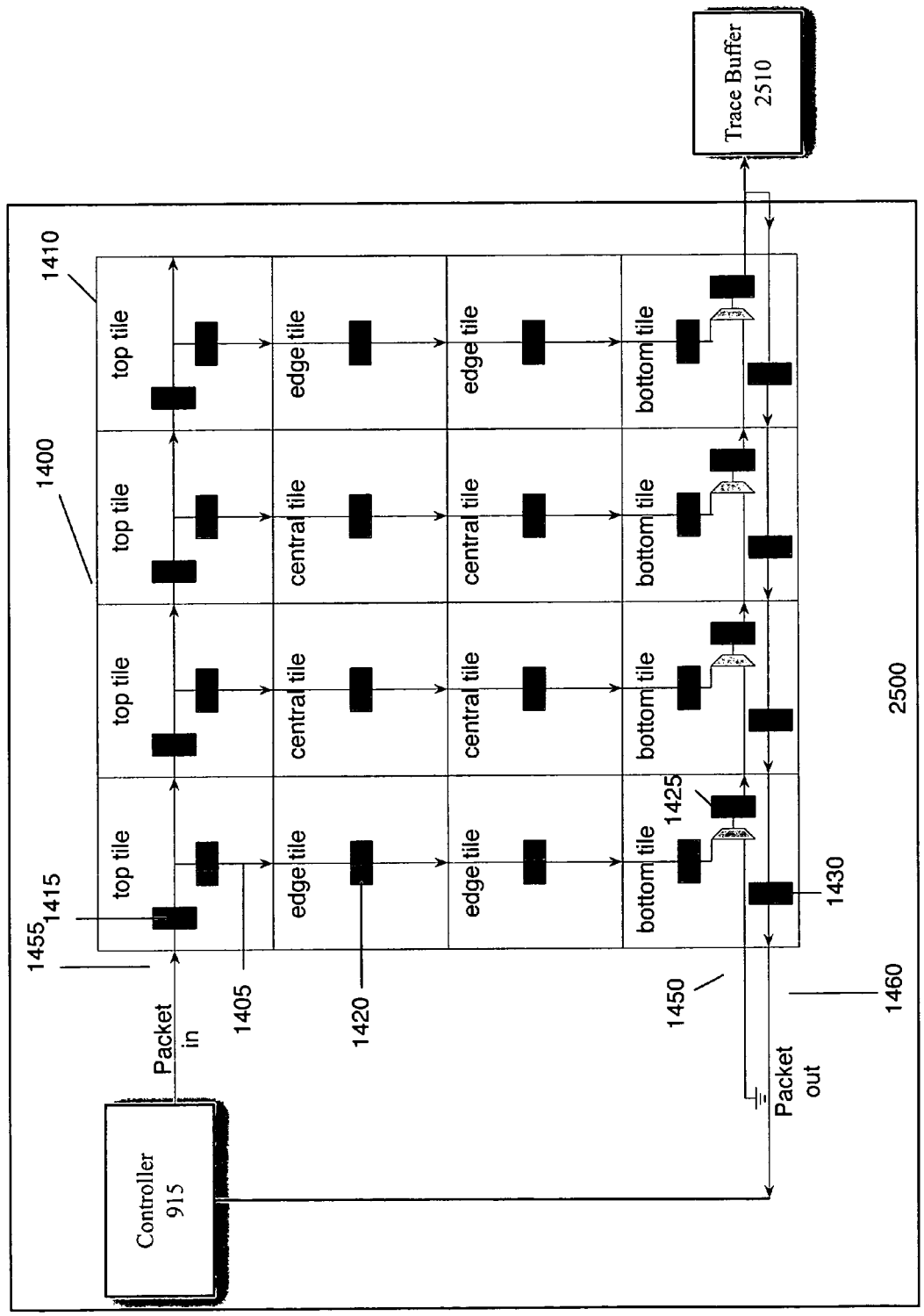
FIG. 25 illustrates a trace buffer according to some embodiments of the invention.

The streaming mode operation can also be used in conjunction with trace buffers that reside outside of the configurable IC. FIG. 25 illustrates one such trace buffer 2510. Specifically, this figure illustrates a trace buffer 2510 that is not on the same IC die 2500 as the tile arrangement 1410 and configuration/debug controller 915. The advantage of placing a trace buffer off chip is that there are less restrictions on the size of the trace buffer when it is not on the same die as the configurable IC. On the other hand, the disadvantage of placing a trace buffer off chip is that such a location consumes some of the input/output resources of the IC. This consumption is often ameliorated by routing fewer signals to the external trace buffer. For instance, while the trace buffer 2310 of FIG. 23 might receive thirty-six bits per each cycle, the trace buffer 2510 of FIG. 25 might receive a fraction of thirty-six bits per each cycle.

The on-chip or off-chip logic analyzer functionality is useful for debugging (i.e., detecting faulty operations) of the configurable IC. It is also useful for collecting statistical data regarding the operation of the configurable IC. It is further useful for verifying correct operation of the IC.

VIII. Check Pointing

Figure 26:
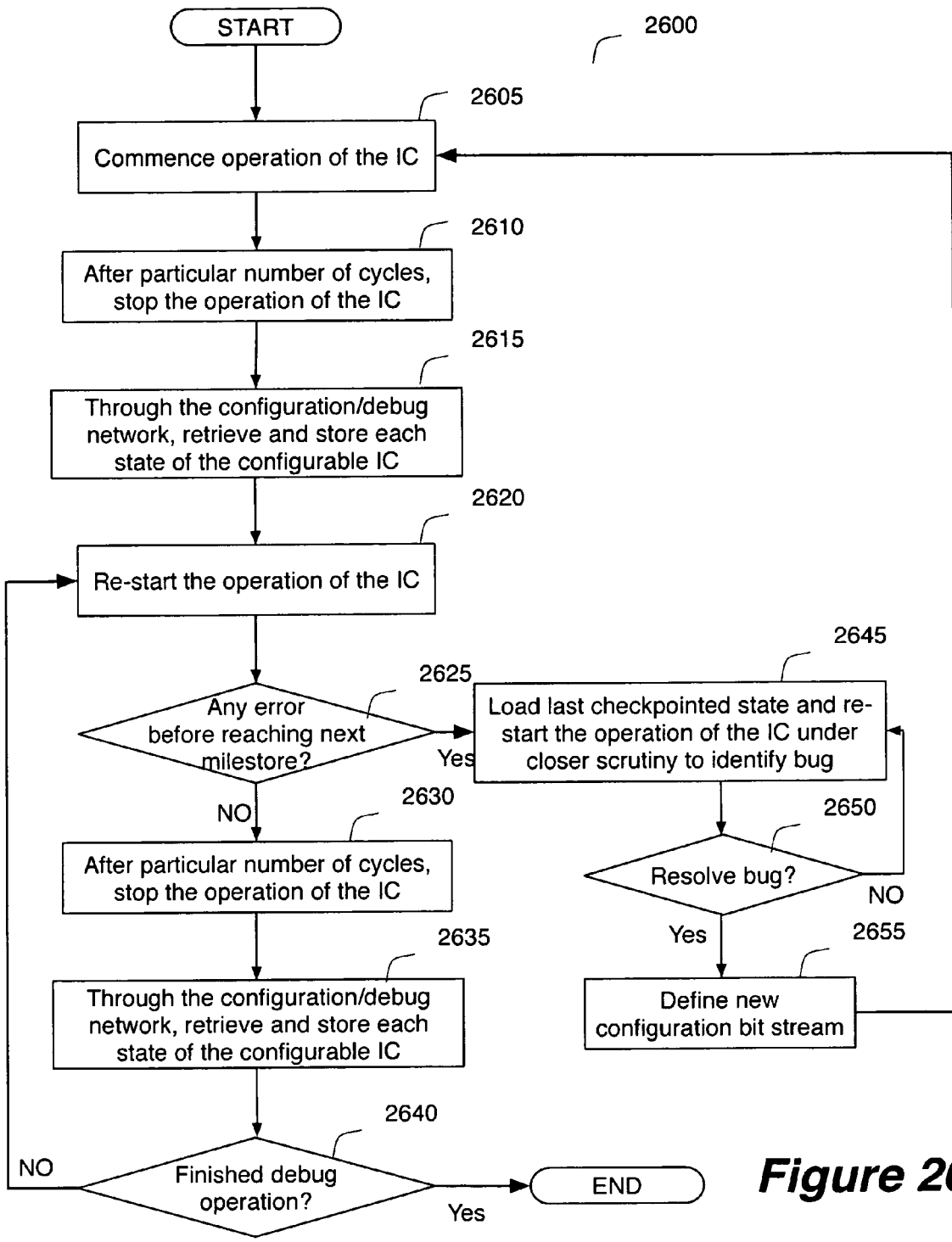
FIG. 26 illustrates a debugging process that conceptually illustrates a series of debugging operations some of which use the configuration/debug network of some embodiments to perform checkpointing.

Another advantage of having all user states on the configuration/debug network is that this availability allows the network to perform checkpointing operations without altering the state of the IC. FIG. 26 illustrates a debugging process 2600 that uses the configuration/debug network of some embodiments to perform checkpointing.

As shown in this figure, the process initially starts (at 2605) the user-design operation of the IC. Next, the process stops (at 2610) the user-design operation of the IC after the IC has operated a particular number of cycles. Section X provides several different examples of starting and stopping user-design operations of the IC.

Through the configuration/debug network, the process then retrieves (at 2615) the state of each UDS element (i.e., RCL, memory cell, register cell, etc.) of the configurable IC. The process accesses each UDS element by stepping through the tiles one at a time (e.g., by using tile X and/or Y frames) and successively reading sets of UDS elements in each tile (e.g., by using Read or Read Increment frames). The process 2600 does not need to step through the tiles in any particular manner, and instead can access the UDS elements in a random access manner. In some embodiments, the process stores (at 2615) each retrieved state of the configurable IC in a memory outside of the configurable IC.

After 2615, the process re-starts (at 2620) the user-design operation of the IC. In re-starting the operation of the IC, the inputs that the process provides to the IC are the inputs that the IC is suppose to receive in the clock cycle that is after the clock cycle that was last checkpointed (i.e., after the clock cycle whose state was checkpointed at 2615).

At 2625, the process determines whether any error has been encountered before reaching the next checkpointing milestone. If not, the process stops (at 2630) the user-design operation of the IC after the IC has operated another particular number of cycles. Through the configuration/debug network, the process then retrieves (at 2635) the state of each UDS element (i.e., RCL, memory cell, register cell, etc.) of the configurable IC. The process accesses each UDS element by stepping through the tiles one at a time (e.g., by using tile X and/or Y frames) and successively reading sets of UDS elements in each tile (e.g., by using Read or Read Increment frames). As at 2615, the process in some embodiments stores (at 2635) each retrieved state of the configurable IC in a memory outside of the configurable IC.

After 2635, the process determines (at 2640) whether it has finished its debugging operation. If so, the process ends. If not, the process returns to 2620.

When the process encounters an error (at 2625) before reaching the next checkpointing milestone, the process stops the operation of the IC at 2645. At 2645, the process then uses the configuration/debug network to load the last checkpointed state of the configurable IC. In other words, the process uses the configuration/debug network to write to the IC's UDS elements, such as its RCLs, memory cells, register cells, etc. Through the configuration/debug network, the process (at 2645) steps through the tiles one at a time (e.g., by using tile X and/or Y frames) and successively writes to sets of UDS elements in each tile (e.g., by using Write or Write Increment frames).

After loading the last checkpointed state back into the configurable IC, the process re-starts (at 2645) the user-design operation of the IC under closer user scrutiny to identify the bug. In re-starting the operation of the IC, the inputs that the process provides to the IC are the inputs that the IC is suppose to receive in the clock cycle that is after the clock cycle that was last checkpointed (i.e., after the clock cycle whose state was loaded back into the IC at 2645).

After 2645, the process transitions to 2650, where an attempt is made to try to identify and resolve the bug (i.e., the mistake) that lead to the error. If the bug can be identified and resolved at 2650, the process (at 2655) computes a new configuration bit stream and reloads this bit stream. From 2655, the process returns to 2605 to re-start the debug operation. On the other hand, when the bug cannot be identified and resolved at 2650, the process returns to 2645 to reload the last checkpointed state, or any of the checkpointed states before the last one, and then returns to 2650, where another attempt is made to identify the bug.

Figure 27:
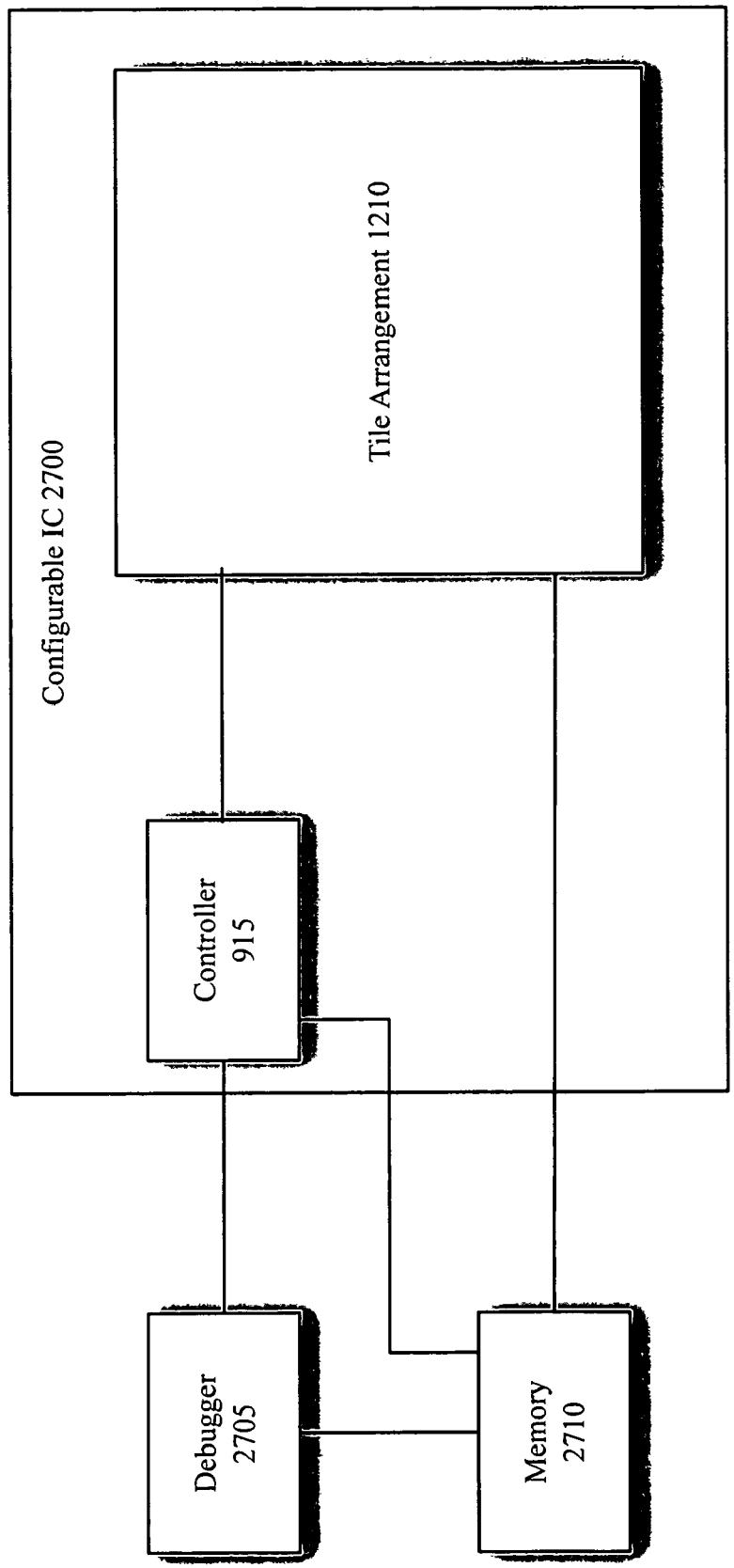
FIG. 27 illustrates a debugger that directs the debugging process of FIG. 26.

FIG. 27 illustrates a debugger 2705 that directs the debugging process 2600 of FIG. 26. In some embodiments, this debugger configures the clock control circuitry in the clock tree of the tile arrangement to stop after a predetermined number of clock cycles. After the predetermined number of clock cycles, the debugger then performs the process 2600 by using the controller 915. The checkpointed data is stored in a memory 2710 outside of the configurable IC 2700 (i.e., in a memory that is not on the same dies as the IC) in some embodiments. When a bug is encountered, the debugger loads the last checkpointed state in the tile arrangement 1410 through the controller 915. It then resumes the configurable IC's operation in a more deliberate manner until the bug is identified.

The checkpointing functionality of the configuration/debug network 1400 is unique. A traditional configurable IC typically cannot implement a checkpointing functionality without altering the state of the IC. For instance, an existing configurable IC allows the state of the configurable IC from being scanned out, but in the process changes the state of the IC. The checkpointing operation of the configuration/debug network 1400 also does not require the reading out of the configuration data to read the IC's state values. The configuration/debug network allows the UDS values to be checkpointed without reading out the configuration data. Also, this network allows the checkpointing of the UDS values for only certain resources, parts or regions of the IC. In other words, the checkpointing operations of some embodiments can be conducted to checkpoint UDS values for only a portion of the IC.

IX. Fast Configuration

Another advantage of the configuration/debug network 1400 is that it allows the configurable IC or portions of it to be configured very quickly. This is because this network is a fully pipelined configuration network. The network is fully pipelined as there are sets of synchronous storage elements (e.g., registers) at the boundary of each horizontally and vertically aligned tile. These sets of storage elements increase the bandwidth through this network as they allow numerous and successive frames to traverse through the tile arrangement at the same time. In other words, it allows one frame to be sent from the configuration/debug controller 915 on each clock cycle. Therefore, unlike prior configuration networks of prior configurable ICs, the speed of the configuration/debug network 1400 is independent of size of the tile arrangement.

The fast configuration rate enabled by the network 1400 has many advantages. One such advantage is that it allows for new configuration bit streams to be loaded from outside of the configurable IC at a fast rate. This, in turn, allows functionalities to be swapped in and out of the configurable IC at a fast rate.

Figure 28:
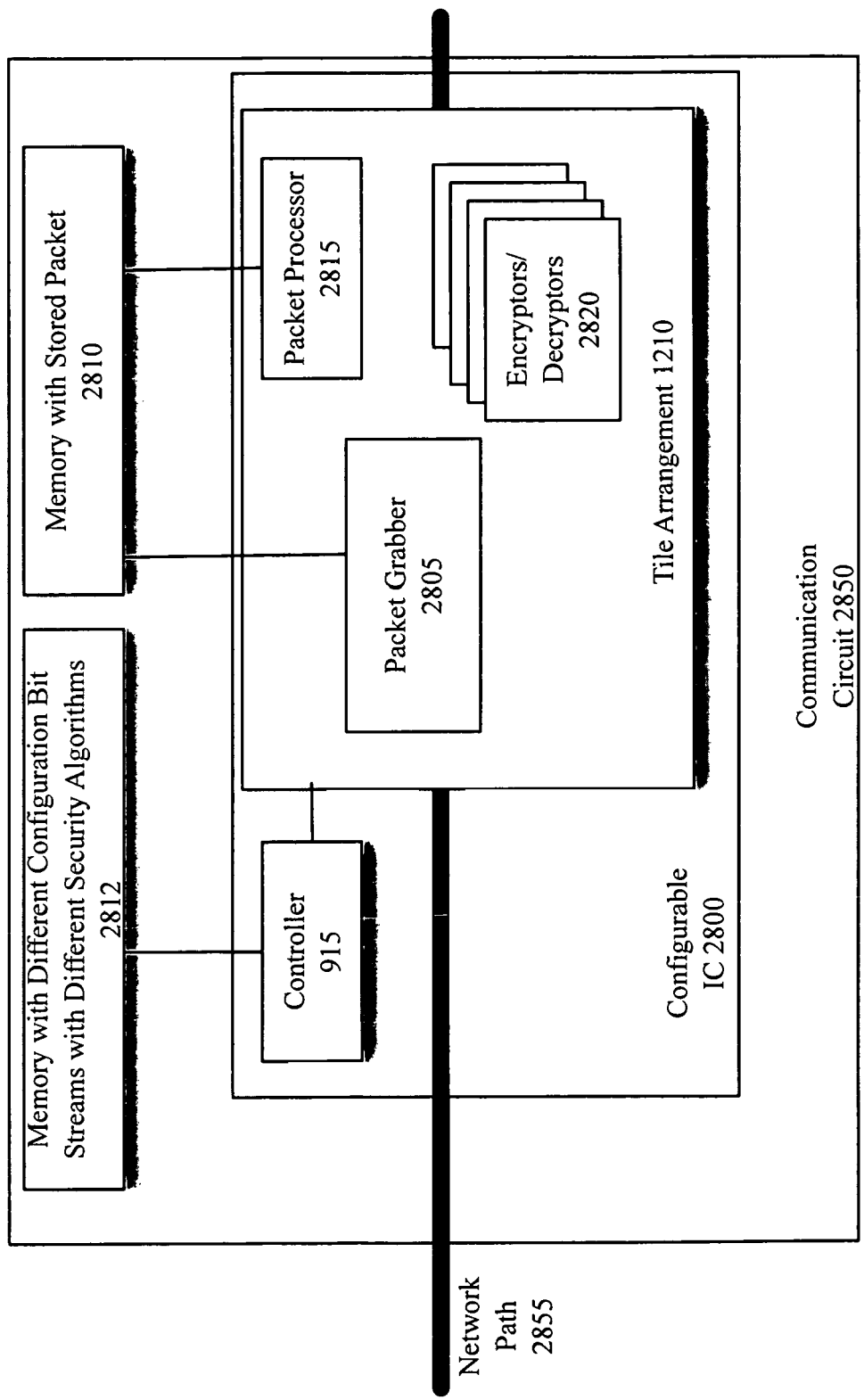
FIG. 28 illustrates an example of the fast swapping of configurations during the user-design operation of an IC.

In fact, functionalities can be swapped for some parts of the configurable IC while other parts of the configurable IC are performing user-design operations. FIG. 28 illustrates an example of this fast swapping of functionalities on the fly (i.e., during the user-design operation of the IC). Specifically, this figure illustrates a configurable IC 2800 that is part of a communication circuit 2850 (e.g., a router, a hub, a switch, etc.). This IC is responsible for performing a number of communication operations, including TCP/IP communications, secure transport layer operations (SSL operations), etc.

The configurable IC 2800 has a configuration controller 915 and a configuration network (not shown) similar to those described above. FIG. 28 conceptually illustrates that the configurable IC 2800 further includes at least three sets of circuit blocks, which the configurable IC uses to perform SSL operations. The three sets include a packet grabber 2805, a packet processor 2815, and a set of encryptors/decryptors 2820. Even though FIG. 28 conceptually illustrates such blocks, one of ordinary skill will realize that the configurable IC might not perform each security operation by a set of configurable resources that fits neatly within one contiguous block. FIG. 28 simply illustrates contiguous blocks, however, to convey the notion that different sets of resources within the tile arrangement 1410 perform different security operations.

The packet grabber 2805 retrieves packets from the network 2855 that the grabber identifies as packets that need IC 2800 needs to process. The packet grabber stores each packet in a memory 2810 for later retrieval by the packet process 2815. In some embodiments, the memory 2810 is a volatile system memory of the communication circuit 2850.

The packet processor 2815 retrieves packets stored in the memory 2810 and directs the various resources of the configurable IC to process each retrieved packet. When a particular packet is encrypted, the packet processor 2815 determines whether an appropriate decryptor 2820 (i.e., a set of logic and interconnect resources that have been configured to perform the appropriate decryption algorithm) for the particular encrypted packet is already loaded on the configurable IC. If so, the packet processor directs the identified decryptor 2820 to decrypt the particular packet.

On the other hand, when the packet processor 2815 determines that the appropriate decryptor 2820 is not loaded on the IC, the packet processor 2815 directs the configuration controller to load the appropriate decryptor onto the configurable IC 2800 from a memory 2812 of the circuit 2850. In some embodiments, the memory 2812 is a non-volatile memory that stores a number of different configuration bit streams for different functionalities (e.g., different decryption operations) that the configurable IC can perform.

Loading the appropriate decryptor 2820 means loading the configuration data that configures a set of logic and routing resources to implement the functionality of the desired decryptor. To load such configuration data, the configuration controller 915 has to obtain the appropriate configuration bit stream from the memory 2812. As it receives this bit stream, the controller 915 formulates configuration packets and routes these packets to the appropriate configurable resources of the IC along the configuration/debug network 1400. Such a load might involve a swapping of decryption functionality, where a set of configurable resources that were configured to serve as one decryptor are configured again to serve as another decryptor.

For instance, the configurable IC 2800 might be configured to perform an RC4 decryption algorithm to decrypt secured network communications. The packet processor 2815 might at some point detect that another cipher, such as an AES cipher, is needed to decrypt a packet. If this other cipher is not already loaded on the configurable IC, the packet processor 2815 directs the configuration controller 915 to load a new bit stream that configures the IC to perform the decryption operation for the new cipher, e.g., the AES cipher. If the configurable IC does not have sufficient resources for the new cipher, the configuration controller might swap out the RC4 cipher and load the new cipher (e.g., the AES cipher) in its place (i.e., might load configuration data that would configure the set of configurable resources that were configured to serve as RC4 decryptor to serve as the other decryptor).

The above described configuration network allows the configuration controller 915 to load in new configuration data for one set of configurable resources while other configurable resources of the IC 2800 are performing user-design operations. For instance, in the above example, while the configuration controller 915 is loading the configuration data that configures one set of circuits to implement the AES decryption cipher, the packet grabber 2805 of the IC can continue grabbing packets and storing them in the memory 2810.

The high speed of this network allows the controller to load the new configuration bit stream very quickly. The ability to load different functionalities on the fly is quite advantageous in this network context as it allows for a smaller (and hence less expensive) configurable IC to handle a diverse traffic mix on a communication network. The IC can be smaller because it does not need to store all the functionalities (i.e., all the configuration data) that it might need at runtime, as it can swap in functionalities (i.e., configuration bit streams) rather quickly through its configuration/debug network.

X. Starting and Stopping User-Design Operation of the IC

The above-described configuration network allows a configurable IC to receive a configuration bit stream that configures the IC to implement a particular user design. A user typically uses a set of software tools to define the configuration data stream that configures the IC (i.e., configures the configurable circuits of the IC) to implement the user's particular user design.

When implementing a particular user design, a configurable IC performs user-design operations that allow the IC to implement the particular user design in a circuit or device. During such user-design operations, the configurable IC (1) can receive user-design input data, which are neither configuration signals nor clocking signals, and (2) can process these signals to implement the particular user design in a circuit or device. Accordingly, in some cases, a configurable IC performs user-design operations when it receives and processes user-design input data and provide user-design output data. For instance, when the configurable IC performs user-design operations, its configurable logic circuits in some cases can receive user-design input data, compute functions based on the user-design input data, and output their results to other circuits inside or outside of the IC. In other contexts, a configurable IC might implement a user design that simply directs the IC to generate output without receiving any user-design input.

When a configurable IC performs user-design operations, its circuits typically receive clocking signals that allow them to process user-design signals. Examples of such clocking signals include (1) clocking signals applied to input/output buffer circuits that allow these circuits to receive and output user-design data, (2) clocking signals applied to the configurable logic circuits that allow these circuits to compute user-design functions, and/or (3) clocking signals applied to the IC's configurable interconnect circuits that allow these circuits to perform user-design connection operations. In case of a reconfigurable IC that has reconfigurable circuits that receive different configuration data sets loaded on the IC, the clock signals can also include clock signals that allow the reconfigurable circuits to step through the different configuration data sets.

In some embodiments, the user-design operation of the IC stops when the IC stop receiving user-design input data and/or stops providing user-design output data. The user-design operation of the IC stops in some embodiments when the clock signals that allow the configurable circuits to process user-design data are stopped (e.g., are maintained at a particular level). In case of a reconfigurable IC that has reconfigurable circuits that receive different configuration data sets loaded on the IC, stopping the clock signals can prevent the reconfigurable circuits from stepping through the different configuration data sets.

While the invention has been described with reference to numerous specific details, one of ordinary skill in the art will recognize that the invention can be embodied in other specific forms without departing from the spirit of the invention. For instance, several embodiments were described above by reference to particular number of inputs, outputs, bits, and bit lines. One of ordinary skill will realize that these values are different in different embodiments. Thus, one of ordinary skill in the art would understand that the invention is not to be limited by the foregoing illustrative details, but rather is to be defined by the appended claims.

What is claimed is:

1. A method of accessing a configurable integrated circuit (IC) having a plurality of user design state (UDS) circuits, the method comprising:
   a) addressing the plurality of the UDS circuits concurrently while the IC is performing user-design operations; and
   b) after addressing the plurality of the UDS circuits, concurrently reading state values stored by the addressed UDS circuits at least a user-design operating frequency, wherein the configurable IC includes a debug network, wherein addressing the plurality of the UDS circuits comprises transmitting at least one address for the plurality of the UDS circuits over the debug network of the configurable IC.

2. The method of claim 1, wherein the transmitted address specifies a type of circuits in the configurable IC.

3. A method of accessing a configurable integrated circuit (IC) having a plurality of user design state (UDS) circuits, the method comprising:
   a) addressing the plurality of the UDS circuits concurrently while the IC is performing user-design operations; and
   b) after addressing the plurality of the UDS circuits, concurrently reading state values stored by the addressed UDS circuits at least a user-design operating frequency, wherein the configurable IC includes a debug network, wherein reading the plurality of the UDS circuits comprises transmitting at least one read instruction over the debug network of the configurable IC.

4. A method of accessing a configurable integrated circuit (IC) having a plurality of user design state (UDS) circuits, the method comprising:
   a) addressing the plurality of the UDS circuits concurrently while the IC is performing user-design operations; and
   b) after addressing the plurality of the UDS circuits, concurrently reading state values stored by the addressed UDS circuits at least a user-design operating frequency, wherein the configurable IC includes a debug network,
wherein the reading comprises reading the state values onto the debug network.

5. The method of claim 4 further comprising:
defining merge values for specifying how state values from two different UDS circuits should merge onto a shared resource of the debug network.

6. The method of claim 5, wherein the shared resource of the debug network is a bus line of the debug network.

7. The method of claim 6, wherein the bus line is a vertical column line.

8. The method of claim 6, wherein the bus line is a horizontal row line.

9. The method of claim 5 further comprising: outputting the read and merged state values from the IC through the debug network.

10. A method of accessing a configurable integrated circuit (IC) having a plurality of user design state (UDS) circuits, the method comprising:
a) addressing the plurality of the UDS circuits concurrently while the IC is performing user-design operations;
b) after addressing the plurality of the UDS circuits, concurrently reading state values stored by the addressed UDS circuits at least a user-design operating frequency, wherein the reading includes concurrently reading state values stored by the addressed UDS circuits in a plurality of successive clock cycles during the user-design operation of the IC.

11. A configurable integrated circuit (IC) comprising:
a plurality of user design state (UDS) circuits; and
a debug network communicatively coupled to the UDS circuits, said debug network for addressing concurrently the plurality of the UDS circuits while the IC is performing user-design operations, wherein said debug network is further for reading concurrently state values stored by the addressed UDS circuits at least a user-design operating frequency.

12. The configurable IC of claim 11, wherein to address the plurality of the UDS circuits, at least one address is transmitted for the plurality of the UDS circuits over the debug network of the configurable IC.

13. The configurable IC of claim 12, wherein the transmitted address specifies a type of circuits in the configurable IC.

14. The configurable IC of claim 11, wherein to read the plurality of the UDS circuits, at least one read instruction is transmitted over the debug network of the configurable IC.

15. The configurable IC of claim 11, wherein to read the plurality of the UDS circuits, the read state values are read onto the debug network.

16. The configurable IC of claim 15, wherein the debug network comprises:
merging circuits for specifying how state values from different UDS circuits should merge onto shared resources of the debug network.

17. The configurable IC of claim 16, wherein a shared resource of the debug network is a bus line of the debug network.

18. The configurable IC of claim 16,
wherein the debug network further comprises intersecting bus lines, and
wherein the merging circuits comprise:
masking circuits for specifying how state values from different UDS circuits connected to a same set of lines should merge onto the same set of lines; and
intersect-merge circuits for specifying how state values carried on two sets of intersecting lines should merge.

19. The configurable IC of claim 18, wherein the intersecting bus lines are vertical and horizontal lines.

20. The configurable IC of claim 11, wherein the debug network reads concurrently state values in a plurality of successive clock cycles during the user-design operation of the IC.

21. A method of accessing a configurable integrated circuit (IC) having a plurality of user design state (UDS) circuits, the method comprising:
a) addressing the plurality of the UDS circuits concurrently; and
b) after addressing the plurality of the UDS circuits, writing at least one common value to the addressed UDS circuits concurrently,
wherein the configurable IC includes a configuration network,
wherein addressing the plurality of the UDS circuits comprises transmitting at least one address for the plurality of the UDS circuits over the configuration network of the configurable IC.

22. The method of claim 21, wherein the transmitted address specifies a type of circuits in the configurable IC.

23. A method of accessing a configurable integrated circuit (IC) having a plurality of user design state (UDS) circuits, the method comprising:
a) addressing the plurality of the UDS circuits concurrently; and
b) after addressing the plurality of the UDS circuits, writing at least one common value to the addressed UDS circuits concurrently,
wherein the configurable IC includes a debug network,
wherein writing to the plurality of the UDS circuits comprises transmitting at least one write instruction over the debug network of the configurable IC.

24. A method of accessing a configurable integrated circuit (IC) having a plurality of user design state (UDS) circuits, the method comprising:
a) addressing a plurality of the UDS circuits concurrently;
b) after addressing the plurality of the UDS circuits, writing at least one common value to the addressed UDS circuits concurrently,
wherein the configurable IC includes a debug network,
wherein the reading comprises reading the state values onto the debug network.

* * * * *